US008941246B2

(12) United States Patent
Miura et al.

(10) Patent No.: US 8,941,246 B2
(45) Date of Patent: Jan. 27, 2015

(54) SEMICONDUCTOR DEVICE AND MANUFACTURING METHOD THEREOF

(71) Applicants: Masayuki Miura, Ota-ku (JP); Taku Kamoto, Yokohama (JP); Takao Sato, Edogawa-ku (JP)

(72) Inventors: Masayuki Miura, Ota-ku (JP); Taku Kamoto, Yokohama (JP); Takao Sato, Edogawa-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 13/623,249

(22) Filed: Sep. 20, 2012

(65) Prior Publication Data

US 2013/0075895 A1 Mar. 28, 2013

(30) Foreign Application Priority Data

Sep. 22, 2011 (JP) ................. 2011-206869
Sep. 12, 2012 (JP) ................. 2012-200287

(51) Int. Cl.
H01L 29/40 (2006.01)
H01L 23/00 (2006.01)
H01L 27/115 (2006.01)
H01L 25/065 (2006.01)
H01L 21/56 (2006.01)

(52) U.S. Cl.
CPC .............. *H01L 24/94* (2013.01); *H01L 27/115* (2013.01); *H01L 24/97* (2013.01); *H01L 25/0657* (2013.01); *H01L 2224/13025* (2013.01); *H01L 2224/14181* (2013.01); *H01L 2224/16145* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73207* (2013.01); *H01L 2224/73253* (2013.01); *H01L 2224/73265* (2013.01); *H01L 2224/97* (2013.01); *H01L 2924/15311* (2013.01); *H01L 2224/45144* (2013.01); *H01L 21/568* (2013.01); *H01L 2224/94* (2013.01); *H01L 2225/0651* (2013.01); *H01L 2225/06517* (2013.01); *H01L 2225/06589* (2013.01); *H01L 2225/06513* (2013.01); *H01L 2225/06541* (2013.01)
USPC ............................. 257/777; 257/686; 257/737

(58) Field of Classification Search
CPC ................... H01L 2924/00; H01L 225/06541
USPC .......................................... 257/686, 777, 737
See application file for complete search history.

(56) References Cited

U.S. PATENT DOCUMENTS 7,531,905 B2 * 5/2009 Ishino et al. ................... 257/777
7,564,127 B2   7/2009 Ikeda et al.
(Continued)

FOREIGN PATENT DOCUMENTS

JP   2006-301863   11/2006
JP   2007-012848   1/2007
JP   2010-287852   12/2010

*Primary Examiner* — Long K Tran
(74) *Attorney, Agent, or Firm* — Oblon, Spivak, McClelland, Maier & Neustadt, L.L.P.

(57) ABSTRACT

In one embodiment, a semiconductor device includes a chip stacked body disposed on an interposer substrate and an interface chip mounted on the chip stacked body. The chip stacked body has plural semiconductor chips, and is electrically connected via through electrodes provided in the semiconductor chips excluding a lowermost semiconductor chip in a stacking order of the plural semiconductor chips and bump electrodes. The interface chip is electrically connected to the interposer substrate via a rewiring layer formed on a surface of an uppermost semiconductor chip in the stacking order or through electrodes provided in the interface chip.

8 Claims, 15 Drawing Sheets

(56) References Cited

U.S. PATENT DOCUMENTS

| | | |
|---|---|---|
| 7,576,433 B2 | 8/2009 | Ishino et al. |
| 7,893,540 B2 | 2/2011 | Ishino et al. |
| 8,238,134 B2 * | 8/2012 | Matsui et al. .................. 365/63 |
| 2011/0104852 A1 | 5/2011 | Ishino et al. |
| 2011/0141789 A1 * | 6/2011 | Matsui et al. .................. 365/51 |

* cited by examiner

SEMICONDUCTOR DEVICE AND MANUFACTURING METHOD THEREOF

CROSS REFERENCE TO RELATED APPLICATIONS

This application is based upon and claims the benefit of priority from Japanese Patent Application No. 2011-206869 filed on Sep. 22, 2011 and Japanese Patent Application No. 2012-200287 filed on Sep. 12, 2012; the entire contents of which are incorporated herein by reference.

FIELD

Embodiments described herein relate generally to a semiconductor device and a manufacturing method thereof.

BACKGROUND

In a semiconductor memory device having a memory chip such as a NAND-type flash memory built therein, there has been applied a structure in which a chip stacked body having thickness-reduced memory chips stacked in multiple tiers is disposed on an interposer substrate, in order to achieve miniaturization and high capacitance. Further, in order to transmit and receive electrical signals between the memory chips at a high speed, it has been performed to electrically connect the memory chips stacked in multiple tiers by providing through electrodes in each of the plural memory chips and connecting the through electrodes by bump electrodes.

In the semiconductor memory device, an interface (IF) circuit performing data communications between the memory chips and an external device is needed. The IF circuit is incorporated in a lowermost memory chip in the chip stacked body, for example. An increase in size of the lowermost memory chip is unavoidable as compared with the other memory chips, and thus the size of the device is increased. Further, two types of the memory chips are needed, so that there are caused problems of deterioration of development efficiency, an increase in manufacturing cost, and so on. It has also been considered that a semiconductor chip having the IF circuit (IF chip) is disposed on the chip stacked body. In such a case, it has been required to achieve a reduction in manufacturing cost and improvement of the speed of data communications with an external device by improving a disposition of the IF chip, connection structures between the IF chip and the memory chips or the interposer substrate, and the like.

DETAILED DESCRIPTION

According to one embodiment, there is provided a semiconductor device including: an interposer substrate having a first surface provided with an external connection terminal and a second surface provided with an internal connection terminal; a chip stacked body, disposed on the second surface of the interposer substrate, having plural semiconductor chips sequentially stacked; and an interface chip mounted on an uppermost semiconductor chip in a stacking order of the plural semiconductor chips. The plural semiconductor chips are electrically connected via first through electrodes provided in the semiconductor chips excluding a lowermost semiconductor chip in the stacking order and a first bump electrode connecting the first through electrodes. The lowermost semiconductor chip is electrically connected to the interposer substrate via at least one semiconductor chip having the first through electrode. The interface chip is electrically connected to the uppermost semiconductor chip via a second bump electrode. The interface chip is electrically connected to the internal connection terminal via a rewiring layer formed on a surface of the uppermost semiconductor chip or a second through electrode provided in the interface chip.

Hereinafter, semiconductor devices in embodiments and manufacturing methods thereof will be explained with reference to the drawings. In the following embodiments, there will be mainly explained a semiconductor memory device using memory chips such as nonvolatile memories of NAND-type flash memories, or the like as semiconductor chips, but the semiconductor devices in the embodiments and the manufacturing methods thereof are not limited to it.

First Embodiment

Figure 1:
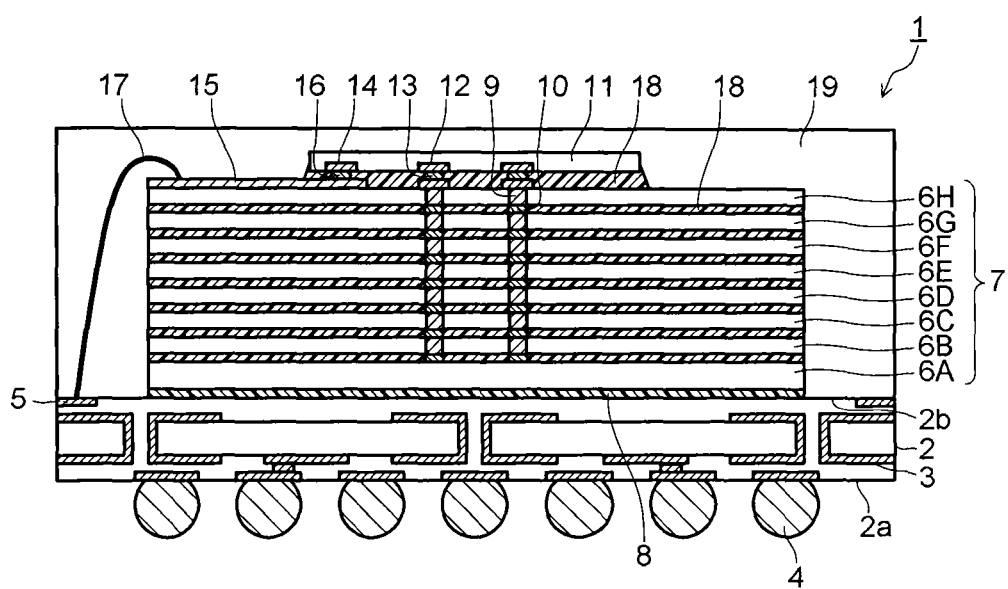
FIG. 1 is a cross-sectional view illustrating a semiconductor device according to a first embodiment.

FIG. 1 illustrates a semiconductor device according to a first embodiment. A semiconductor device 1 illustrated in FIG. 1 is a semiconductor memory device using memory chips as the semiconductor chips. The semiconductor device 1 includes an interposer substrate 2. The interposer substrate 2 is formed by providing a wiring network 3 on a front surface or inside of an insulating resin substrate, for example, and concretely, a printed wiring substrate (a multilayer printed substrate or the like) using an insulating resin such as a glass-epoxy resin or a BT resin (Bismaleimide-Triazine resin) is applied. The interposer substrate 2 has a first surface 2a to be a formation surface of external connection terminals and a second surface 2b to be a disposition surface of a chip stacked body.

On the first surface 2a of the interposer substrate 2, external connection terminals 4 are formed. When the semiconductor memory device 1 is used as a BGA package, the external connection terminals 4 are each formed of a projecting terminal made of solder ball, solder plating, Au plating, and the like. When the semiconductor memory device 1 is used as an LGA package, metal lands are provided as the external connection terminals 4. On the second surface 2b of the interposer substrate 2, internal connection terminals 5 are provided. The internal connection terminals 5 function as connection portions (connection pads) at the time of connecting the chip stacked body, and are electrically connected to the external connection terminals 4 via the wiring network 3 of the interposer substrate 2.

On the second surface 2b of the interposer substrate 2, a chip stacked body 7 having plural memory chips 6 (6A to 6H) is disposed. The chip stacked body 7 is constituted in a manner that the plural memory chips 6B to 6H are sequentially stacked on the lowermost memory chip 6A. The plural memory chips 6A to 6H have the same rectangular shape. In FIG. 1, the chip stacked body 7 is constituted by the eight memory chips 6A to 6H, but the number of the memory chips 6 is not limited to this. The number of the memory chips 6 is properly set according to a storage capacity of the single memory chip 6, a storage capacity and use application of the semiconductor memory device 1, and the like.

The terms of lowermost memory chip and uppermost memory chip in the chip stacked body 7 are based on a stacking order of the plural memory chips 6A to 6H, and the lowermost memory chip and the uppermost memory chip do not necessarily agree with disposition positions on the interposer substrate 2. The case of the memory chip of the certain number-th tier is also the same. The lowermost memory chip 6A indicates the memory chip positioned at the lowermost level when the plural memory chips 6A to 6H are stacked. The uppermost memory chip 6H indicates the memory chip positioned at the uppermost level when the plural memory chips 6A to 6H are stacked.

The chip stacked body 7 is mounted on the second surface 2b of the interposer substrate 2 by adhering a lower surface (a non-circuit surface) of the lowermost memory chip 6A to the second surface 2b of the interposer substrate 2 with an adhesive layer 8. The lowermost memory chip 6A in the stacking order of the chip stacked body 7 is only adhered to the second surface 2b of the interposer substrate 2 with the adhesive layer 8 made of an insulating resin and the like, and is not directly electrically connected to wirings (the internal connection terminal 5) provided on the second surface 2b of the interposer substrate 2. The lowermost memory chip 6A is electrically connected to the wirings of the interposer substrate 2 via the memory chips 6B to 6H.

The chip stacked body 7 has the memory chips 6 adjacent to each other electrically connected via through electrodes (Through Silicon Via: TSV) 9 provided in the respective insides of the second memory chip 6B to the uppermost memory chip 6H and bump electrodes 10 connecting these through electrodes 9. The memory chips 6B to 6H are sequentially stacked on the memory chip 6A adhered to the interposer substrate 2, for example. The lowermost memory chip 6A is only adhered to the second surface 2b of the interposer substrate 2 with the adhesive layer 8, and is electrically connected only to the second memory chip 6B. For this reason, the lowermost memory chip 6A does not need to have the through electrode. The lowermost memory chip 6A does not have the through electrode.

The plural memory chips 6A to 6H are electrically connected via the through electrodes 9 provided in the memory chips 6B to 6H excluding the lowermost memory chip 6A and the bump electrodes 10. FIG. 1 illustrates electrical connection structures between the memory chips 6 adjacent to each other in a simplified manner. Concretely, a first electrode terminal formed on an upper surface (a circuit surface) of the memory chip 6 on the lower side to be electrically connected to the through electrodes 9 and second electrode terminals formed on a lower surface (a non-circuit surface) of the memory chip 6 on the upper side to be electrically connected to the through electrodes 9 are brought into contact with each other and are integrated by melting at least one electrode terminal of the first and second electrode terminals, and thereby the memory chips 6 adjacent to each other are electrically connected. The bump electrodes 10 illustrated in FIG. 1 each indicate a connection body of the first electrode terminal and the second electrode terminal. The memory chips 6B to 6H are sequentially stacked on the memory chip 6A adhered to the interposer substrate 2 while the memory chips 6 adjacent to each other are electrically connected via the bump electrodes 10 each being the connection body of the first and second electrode terminals.

As forming materials of the first and second electrode terminals, a solder material made of an Sn alloy in which Cu, Ag, Bi, In and so on are added to Sn and a metallic material such as Au, Cu, Ni, Sn, Pd, and Ag can be cited. As concrete examples of the solder material (Pb-free solder), an Sn—Cu alloy, an Sn—Ag alloy, an Sn—Ag—Cu alloy, and so on can be cited. The metallic material may be a stacked film of plural metal films such as Ni/Au or Ni/Pd/Au without being limited to a single layer film. Further, the metallic material may also be an alloy containing the metals as described above. As a combination of the first electrode terminal and the second electrode terminal, a solder/solder, a metal/solder, a solder/metal, a metal/metal, and so on can be cited.

As shapes of the first and second electrode terminals, a combination of projecting shapes with each other such as a hemispherical shape and a columnar shape, and a combination of a projecting shape and a flat shape such as a pad can be cited.

At least one of the first and second electrode terminals is preferably made of the solder material. When handleability of the memory chips 6 when manufacturing the chip stacked body 7, and so on are further considered, it is preferable to form the first electrode terminals each made of the metallic material such as Ni/Au or Ni/Pd/Au on the upper surface (the circuit surface) of each of the memory chips 6 and to form the second electrode terminals each made of the solder material such as an Sn—Cu alloy, an Sn—Ag alloy, or an Sn—Ag—Cu alloy on the lower surface (the non-circuit surface) of each of the memory chips 6. In the above case, the first electrode terminal made of the metallic material preferably has a flat shape, and the second electrode terminal made of the solder material preferably has a projecting shape. The upper surfaces each having the flat first electrode terminals thereon are kept, and thereby the handleability of the memory chips 6 is improved, and this makes it possible to improve positioning accuracy between the memory chips 6 and connectivity by the bump electrodes 10.

The outer shapes of the memory chips 6A to 6H constituting the chip stacked body 7 are set to be same rectangular shape as described above. With regard to the thicknesses of the memory chips 6A to 6H, the memory chips 6A to 6H may also each have the same thickness, but the thickness of the lowermost memory chip 6A is preferably made thicker than that of the other memory chips 6B to 6H. By increasing the thickness of the lowermost memory chip 6A, it is possible to suppress stress generated by the difference in thermal expansion coefficient between the interposer substrate 2 and the memory chip 6, warpage of the memory chip 6, and a connection failure between the memory chips 6 based on them (a connection failure caused by the bump electrodes) and further to achieve a reduction in manufacturing cost of the chip stacked body 7 and improvement of reliability. The above is the same also in the other embodiments.

That is, when the memory chip 6A of the lowermost tier is adhered to the interposer substrate 2 and a curing process is performed in order to cure the adhesive layer 8, warpage is likely to occur based on the difference in thermal expansion coefficient between the memory chip 6A and the interposer substrate 2. The thermal expansion coefficient of Si constituting the memory chip 6A is 3 ppm/° C., but the thermal expansion coefficient of a resin substrate used as the interposer substrate 2 is 10 ppm/° C. or more, so that the expansion at the time of the curing process of the adhesive layer 8 (at the time of a heating process) becomes larger in the interposer substrate 2 than in the memory chip 6A. For this reason, by contraction in a cooling process after the curing process, in an adhered body of the interposer substrate 2 and the memory chip 6A, warpage convex toward the upper surface side of the chip is likely to occur.

If the warpage when the lowermost memory chip 6A is adhered to the interposer substrate 2 is large, the stacking of the memory chips 6B to 6H becomes difficult to be performed. When an amount of the warpage of the lowermost memory chip 6a after the adhesion is large with respect to the height of the bump electrode 10, in stacking the memory chips 6B to 6H, the electrode terminal on the front surface of the chip on the lower side and the electrode terminal on the rear surface of the chip on the upper side do not come into contact with each other, and thus a connection failure is caused. When the memory chips 6 are heated at the time of being stacked and the memory chips 6 are exposed to high temperature in a reflow process after the stacking, the connection is made under high temperature because the amount of warpage is reduced at the time of heating. However, when the memory chips 6 are thereafter cooled to room temperature, the warpage occurs, and there is a risk that the connection by the bump electrodes is broken by the above warpage and chip cracking starting from connection portions occurs.

The amount of warpage to occur relies on a property and a curing temperature of an adhesive, the thicknesses of the memory chip 6 and the interposer substrate 2, and so on, but the most dominant factor of the warpage is the thickness of the memory chip (semiconductor chip) 6. As the thickness of the lowermost memory chip 6A is thinner, the amount of warpage becomes larger. By increasing the thickness of the lowermost memory chip 6A, it is possible to reduce the amount of warpage after the lowermost memory chip 6A is adhered to the interposer substrate 2. Thus, the thickness of the lowermost memory chip 6A is preferably thicker than that of the other memory chips 6B to 6H. This makes it possible to improve a stacking yield of the memory chips 6B to 6H.

The memory chips 6B to 6H excluding the lowermost memory chip 6A are each preferably reduced in thickness in order to reduce the thickness of the chip stacked body 7 and further the thickness of the semiconductor memory device 1. Concretely, the memory chips 6B to 6H each having a thickness in a range of 20 to 40 μm are preferably used. The memory chip 6A preferably has a thickness in a range of 100 to 300 μm. When the thickness of the memory chip 6A is less than 100 μm, an effect of suppressing the warpage cannot be obtained sufficiently. When the thickness of the memory chip 6A is increased too much, the thickness of the chip stacked body 7 is increased, and further the size of the semiconductor memory device 1 becomes too large. The thickness of the lowermost memory chip 6A is preferably set to 300 μm or less. The lowermost memory chip 6A does not need the through electrodes, so that it is possible to easily increase the chip thickness.

It is also effective to use a semiconductor chip in which a supporting plate having a thickness equivalent to the increased thickness of the memory chip 6 is adhered to its non-circuit surface with an adhesive, in place of using the thick memory chip 6A. In the case of using the supporting plate, a memory chip whose thickness is reduced similarly to the memory chips 6B to 6H can be applied to the lowermost memory chip 6A. As the supporting plate, for example, a Si plate or a metal plate having a physical property value equivalent to that of Si is applied. In terms of a reduction in warpage, a metal plate having a thermal expansion coefficient equivalent to that of Si and having a large Young's modulus is preferably used. As such a metal plate, an Fe—Ni based alloy plate such as, for example, a 42 alloy is cited and is advantageous as compared with Si in terms of the cost. The supporting plate is preferably formed of a material having a large Young's modulus. As the Young's modulus is larger, a larger effect of reducing the warpage can be obtained with a thin plate thickness.

The above-described manufacturing process of the chip stacked body 7 is effective not only in the case when the plural memory chips 6 are directly stacked on the interposer substrate 2 but also in the case when the plural memory chips 6 are temporarily adhered to a supporting substrate such as a glass substrate with an adhesive to be stacked. In the case when the chip stacked body 7 is manufactured on the supporting substrate, the chip stacked body 7 separated from the supporting substrate is mounted on the interposer substrate 2. Also in such a case, the lowermost thick memory chip 6A and the memory chip having the supporting plate adhered to the non-circuit surface act effectively. Further, it is also possible that the chip stacked body 7 is manufactured on the supporting substrate made of a metal substrate, a Si substrate, or the like, and the chip stacked body 7 adhered to the supporting substrate is mounted on the interposer substrate 2. In the above case, the supporting substrate can not only become a base on which the plural memory chips 6 are stacked but also function as the supporting plate of suppressing the warpage of the memory chip 6. The manufacturing process of the chip stacked body 7 using the supporting substrate will be described in detail later.

On the uppermost memory chip 6H in the chip stacked body 7, there is mounted an interface chip (IF chip) 11 provided with an interface (IF) circuit for performing data communications between the plural memory chips 6A to 6H constituting the chip stacked body 7 and an external device. The IF chip 11 is electrically connected to the chip stacked body 7 and has internal connection electrodes 12 performing data communications with the respective memory chips 6A to 6H. The internal connection electrodes 12 of the IF chip 11 are electrically connected to the through electrodes 9 of the uppermost memory chip 6H via bump electrodes 13. The IF chip 11 is flip-chip connected (FC connected) to the uppermost memory chip 6H.

The IF chip 11 has an external connection electrodes 14 performing data communications with an external device via the interposer substrate 2. On a surface of the uppermost memory chip 6H (a mounting surface of the IF chip 11), a rewiring layer 15 is formed in order to electrically connect the external connection electrodes 14 of the IF chip 11 and the internal connection terminals 5 of the interposer substrate 2. One end portion of the rewiring layer 15 is electrically connected to the external connection electrode 14 of the IF chip 11 via a bump electrode 16. The other end portion of the rewiring layer 15 and the internal connection terminal 5 of the interposer substrate 2 are electrically connected via a bonding wire (a metal wire such as an Au wire) 17.

That is, the external connection electrode 14 of the IF chip 11 is electrically connected to the internal connection terminal 5 of the interposer substrate 2 via the bump electrode 16, the rewiring layer 15, and the bonding wire 17. One end portion of the bonding wire 17 is connected to a bonding pad (not illustrated) which is disposed on the outer peripheral side of the surface of the uppermost memory chip 6H and is electrically connected to the rewiring layer 15. In the above case, the rewiring layer 15 is formed so as to connect the bonding pad and a connection portion of the external connection electrode 14. The bonding pad may also be formed on an end portion, of the rewiring layer 15, positioned on the outer peripheral side of the chip.

In FIG. 1, the example where the IF chip 11 provided with the IF circuit is mounted on the chip stacked body 7 has been explained, but the semiconductor chip to be mounted on the chip stacked body 7 is not limited to the IF chip 11 having only the IF circuit mounted thereon. The IF chip 11 for performing data communications between the chip stacked body 7 and an external device may also be one on which a controller circuit is mounted in addition to the IF circuit. On the chip stacked body 7, a mixed chip of the IF circuit and the controller circuit, namely a chip combined with a controller and an IF may also be mounted. These are properly selected based on the use application of the semiconductor memory device 1, a configuration of an external device, and the like.

An underfill resin 18 is filled into a gap between each two of the memory chips 6 constituting the chip stacked body 7 and further a gap between the uppermost memory chip 6H and the IF chip 11. Further, on the second surface 2b of the interposer substrate 2, a sealing resin layer 19 made of an insulating resin such as an epoxy resin is formed by molding, for example, so as to seal the chip stacked body 7 and the IF chip 11 together with the bonding wire 17. In this manner, the semiconductor memory device (a stack semiconductor device/stack semiconductor package) 1 in the first embodiment is configured.

In the semiconductor memory device 1 in the first embodiment, the IF circuit is provided in a chip (IF chip 11) different from the memory chips 6, and the chip is mounted on the chip stacked body 7. Thus, the outer shapes of the plural memory chips 6A to 6H can be set to be the same, so that it is possible to miniaturize the chip stacked body 7 in which the plural memory chips 6A to 6H are stacked and further to reduce the package size of the semiconductor memory device 1 including the chip stacked body 7, as compared with the case where the IF circuit is incorporated in a lowermost memory chip, for example. Further, the memory chips 6 having the same structure except that the lowermost memory chip 6A does not have the through electrode are used for the plural memory chips 6A to 6H, so that it becomes possible to achieve improvement of development efficiency, a reduction in manufacturing cost, and the like.

The chip stacked body 7 is electrically connected to the interposer substrate 2 via the IF chip 11. In other words, the chip stacked body 7 is only adhered to the second surface 2b of the interposer substrate 2, so that the cost required for mounting the chip stacked body 7 can be reduced. Additionally, there is no need to form the through electrodes in the lowermost memory chip 6A, so that it is possible to easily increase the thickness of the lowermost memory chip 6A. For this reason, when the chip stacked body 7 is adhered to the interposer substrate 2, an effect of stress based on the difference in thermal expansion between the lowermost memory chip 6A and the interposer substrate 2 and the warpage of the memory chip 6A are suppressed. These make it possible to improve electrical connection reliability between the memory chips 6, particularly, the electrical connection reliability between the lowermost memory chip 6A and the second memory chip 6B.

Further, the IF chip 11 performing data communications between the chip stacked body 7 and an external device is electrically connected to the interposer substrate 2 via the rewiring layer 15 formed on the uppermost memory chip 6H and the bonding wire 17. In this manner, a connection structure between the IF chip 11 and the interposer substrate 2 is simplified, so that it is possible to reduce the number of manufacturing processes and the manufacturing cost of the chip stacked body 7 containing the IF chip 11, as compared with the case where the through electrodes for connecting the IF chip and the interposer substrate, and so on are provided in the memory chip. That is, it becomes possible to provide the miniaturized semiconductor memory device 1 excellent in reliability at low cost. Additionally, the connection structure between the IF chip 11 and the interposer substrate 2 is simplified, thereby making it possible to achieve improvement of the speed of data communications between the chip stacked body 7 and an external device, and so on.

Second Embodiment

Next, a semiconductor device according to a second embodiment will be explained with reference to FIG. 2 to FIG. 4. The semiconductor memory device 1 in the first embodiment is manufactured in a manner that the underfill resin 18 is filled into a gap between each two of the plural memory chips 6 and then the rewiring layer 15 and the interposer substrate 2 are electrically connected by the bonding wire 17. In the above case, when the underfill resin 18 is filled into the gap between of the plural memory chips 6, there is a risk that the rewiring layer 15 and the internal connection terminal 5 are contaminated. When the rewiring layer 15 and the internal connection terminal 5 are contaminated with the underfill resin 18, the electrical connection by wire bonding cannot be performed.

For such a point, it is effective that the rewiring layer 15 on the chip stacked body 7 and the interposer substrate 2 are electrically connected by the bonding wire 17, and then the underfill resin 18 is filled into the chip stacked body 7. In the above case, the wire bonding is performed on the chip stacked body 7 in which the underfill resin 18 is not filled, so that there is a risk that cracking and the like occur in the memory chips 6. Thus, spacers are disposed in a gap between each two of the memory chips 6 constituting the chip stacked body 7. This makes it possible to soundly perform the wire bonding on the chip stacked body 7 in which the underfill resin 18 is not filled after the contamination of the rewiring layer 15 and the internal connection terminal 5 with the underfill resin 18 is prevented.

Figure 2:
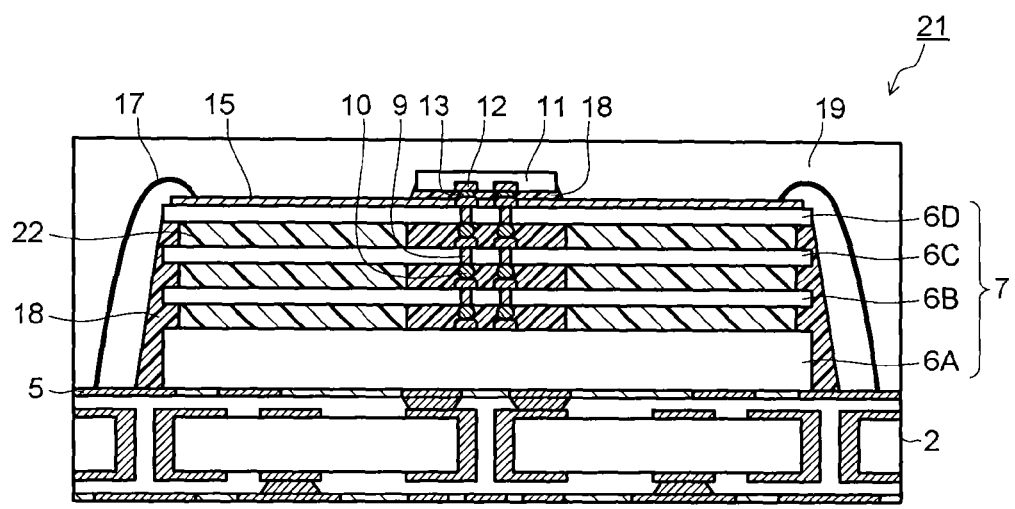
FIG. 2 is a cross-sectional view illustrating a semiconductor device according to a second embodiment.
Figure 3A:
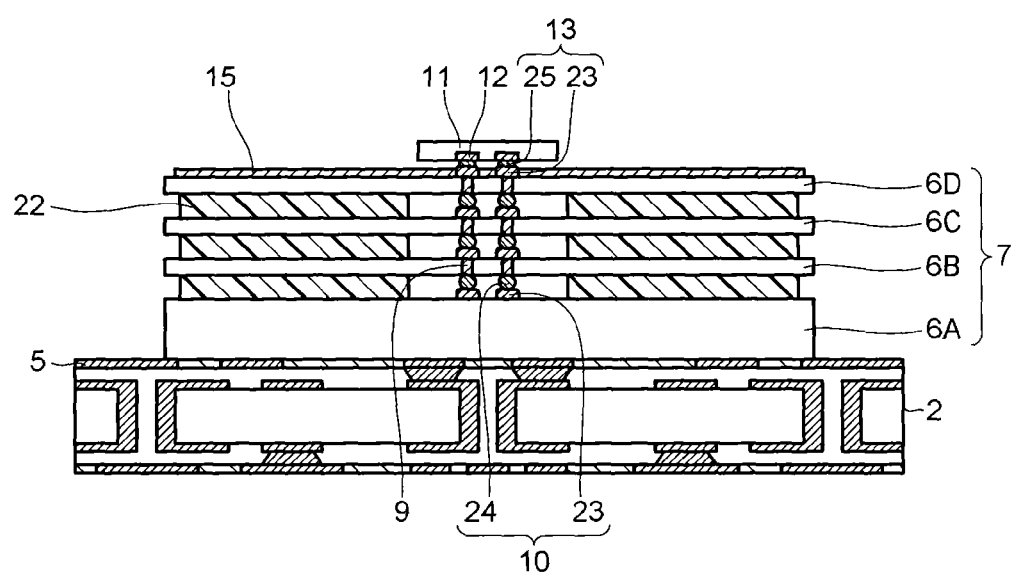
FIG. 3A to FIG. 3C are cross-sectional views each illustrating a manufacturing method of the semiconductor device illustrated in FIG. 2.

FIG. 2 illustrates a semiconductor device (semiconductor memory device) 21 according to the second embodiment. The semiconductor memory device 21 according to the second embodiment basically has the same configuration as that of the semiconductor device 1 according to the first embodiment except that spacers 22 are disposed in a gap between each two of the memory chips 6 constituting the chip stacked body 7 and the underfill resin is filled after performing the wire bonding. The spacer 22 is preferably formed of an insulating resin such as an epoxy resin, a polyimide resin, an acrylic resin, a phenol resin, or a benzocyclobutene resin.

The spacer 22 may also be formed of a resin having a photosensitivity and a thermosetting property. As a concrete example of the photosensitive and thermosetting resin, a thermosetting resin containing a photosensitive agent such as a photosensitive adhesive resin can be cited. The photosensitive and thermosetting resin is cured by irradiation of ultraviolet light at the formation stage of the spacers 22, so that it is possible to make the spacers 22 function as a stopper keeping a gap between the memory chips 6. Further, the resin is heated to be cured, and thereby the spacers 22 are adhered to the memory chips 6, so that it is possible to increase adhesive strength between the memory chips 6 in the chip stacked body 7 in which the underfill resin is not filled. These make it possible to suppress occurrence of a short circuit caused by excessive crushing of the bump electrodes 10 and occurrence of a connection failure (open failure) of the bump electrodes 10 caused by the warpage of the memory chip 6.

The spacers 22 effectively function not only in the case when the wire bonding is performed and then the underfill resin 18 is filled, but also for the chip stacked body 7 in which the plural memory chips 6 are electrically connected by the through electrodes 9 and the bump electrodes 10. The spacers 22 are disposed in a gap between each two of the memory chips 6, and thereby when the memory chips 6 adjacent to each other are connected by the bump electrodes 10, a gap between the memory chips 6 can be kept. Thus, it is possible to suppress excessive crushing of the bump electrodes 10 and occurrence of a short circuit failure. Further, by using the spacers 22 having adhesiveness, it is possible to obtain a function of keeping a gap between each two of the memory chips 6 and an effect of improving adhesive strength between the memory chips 6. Thus, it is possible to suppress occurrence of a short circuit caused by excessive crushing of the bump electrodes 10 and occurrence of a connection failure of the bump electrodes 10 caused by the warpage of the memory chip 6. The spacers 22 are preferably used also in the chip stacked body 7 in each of the other embodiments.

A manufacturing process of the semiconductor device 21 according to the second embodiment will be explained with reference to FIG. 3A to FIG. 3C and FIG. 4. As illustrated in FIG. 3A, the plural memory chips 6 (6A to 6D) are stacked on the second surface 2b of the interposer substrate 2. First, the lowermost memory chip 6A is adhered to the second surface 2b of the interposer substrate 2. On the circuit surface of the memory chip 6A, first electrode terminals 23 each made of the above-described metallic material are provided. On the memory chip 6A, the second memory chip 6B is stacked. On the non-circuit surface of the memory chip 6B, second electrode terminals (solder bumps) 24 each made of the above-described solder material and the spacers 22 are provided. On the circuit surface of the memory chip 6B, similarly to the memory chip 6A, the first electrode terminals 23 each made of the metallic material are provided.

The memory chip 6B, after positioning of the second electrode terminals 24 on the first electrode terminals 23 on the memory chip 6A is performed, is pressure-bonded to the memory chip 6A while keeping a gap between the memory chips 6A and 6B with the spacers 22. In the same manner, the third memory chip 6C and the fourth memory chip 6D are stacked. Finally, the IF chip 11 having electrode terminals 25 formed on its circuit surface is stacked on the memory chip 6D. The electrode terminals 25 are each made of the solder material and are connected to the first electrode terminals 23 formed on the circuit surface of the memory chip 6D of the fourth tier. The pressure-bonding temperature may be set to the connection temperature of the electrode terminals 23 and 24 (25) or higher, or may also be a temperature at which the electrode terminals 23 and 24 (25) are temporarily fixed. In the case when the electrode terminals 23 and 24 (25) are temporarily fixed, all the semiconductor chips containing the memory chips 6 and the IF chip 11 are stacked, and then are pressure-bonded or reflowed in a reducing atmosphere at a temperature of the connection temperature of the electrode terminals 23 and 24 (25) or higher.

In this manner, the memory chips 6A to 6D are electrically and mechanically connected by the bump electrodes 10 (connection bodies each composed of the first electrode terminal 23 and the second electrode terminal 24) to manufacture the chip stacked body 7, and on the chip stacked body 7, the IF chip 11 is mounted. The IF chip 11 is electrically and mechanically connected to the chip stacked body 7 via the bump electrodes 13 (connection bodies each composed of the electrode terminal 23 and the electrode terminal 25). The spacers 22 are disposed in a gap between each two of the memory chips 6A to 6D constituting the chip stacked body 7.

Figure 3B:
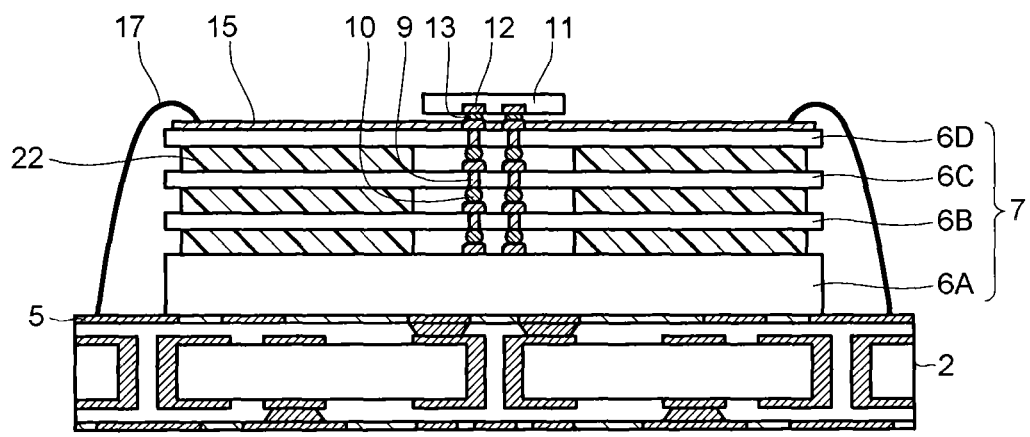
Figure 3C:
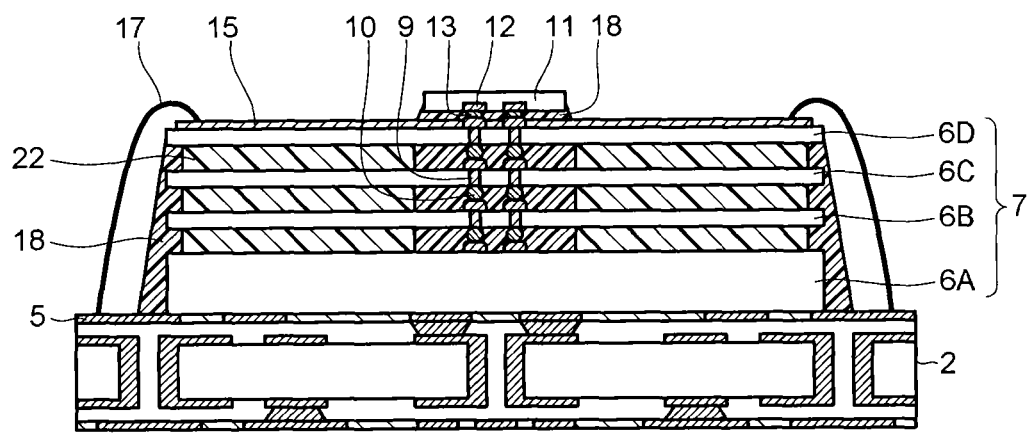
Figure 4:
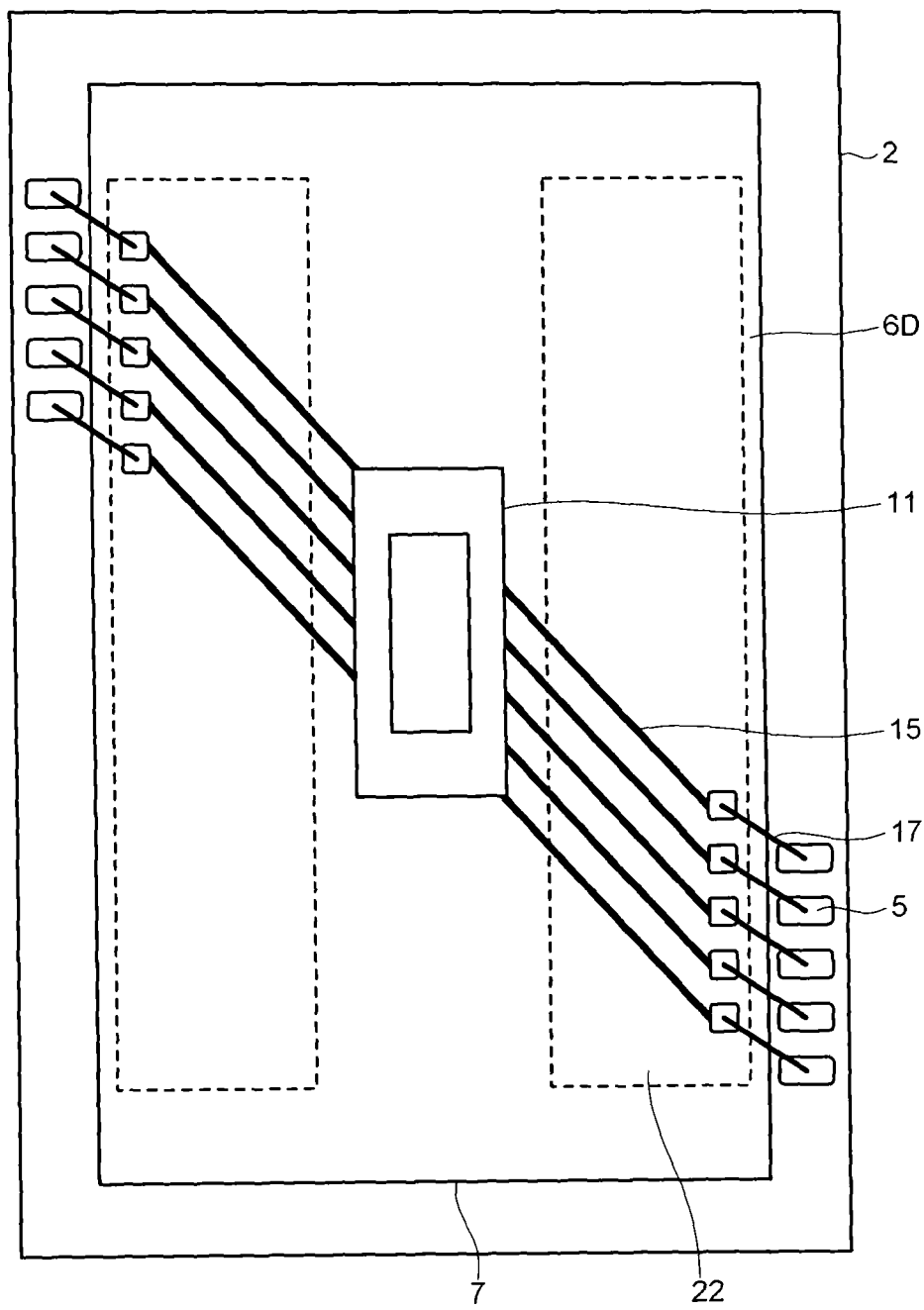
FIG. 4 is a plan view of a manufacturing process of the semiconductor device illustrated in FIG. 3B.

As illustrated in FIG. 3B, the wire bonding is performed on the chip stacked body 7. The bonding wires 17 are each connected to the bonding pad provided on the end portion of the rewiring layer 15 and the internal connection terminal 5 on the interposer substrate 2. The spacers 22, as illustrated in FIG. 4, are disposed so as to be positioned below the bonding pads provided on the end portions of the rewiring layers 15. Thus, occurrence of deflection and cracking of the memory chips 6 at the time of wire bonding is suppressed. As illustrated in FIG. 3C, the underfill resin 18 is filled into a gap between each two of the memory chips 6A to 6D and a gap between the memory chip 6D and the IF chip 11. The underfill resin 18 is cured. By filling the underfill resin 18 after the wire bonding, the connection reliability by the bonding wires 17 can be maintained.

Third Embodiment

Next, a semiconductor device (a semiconductor memory device) according to a third embodiment and a manufacturing method thereof will be explained with reference to FIG. 5A to FIG. 5F. In the semiconductor memory device 1 in the first embodiment, the plural memory chips 6 are stacked on the interposer substrate 2, and the underfill resin 18 is filled on the interposer substrate 2. In the above case, when the underfill resin 18 is filled into a gap between each two of the plural memory chips 6, there is a risk that the internal connection terminal 5 on the interposer substrate 2 is contaminated with the underfill resin 18. Further, there is a risk that due to the difference in thermal expansion coefficient between the memory chip 6 and the interposer substrate 2, the warpage and the like occur in the memory chip 6.

For such a point, it is effective to stack the plural memory chips 6 on a supporting substrate. By stacking the plural memory chips 6 on the supporting substrate, the contamination of the internal connection terminal 5 on the interposer substrate 2 with the underfill resin 18 can be prevented. Further, a metal plate having a physical property value equivalent to that of Si or the like is used for the supporting substrate, and thereby it is possible to suppress the warpage of the memory chip 6 and a connection failure of the bump electrodes 10 based on it. The supporting substrate may be separated after the plural memory chips 6 are stacked, or the chip stacked body 7 having the supporting substrate may also be mounted on the interposer substrate 2. In the third embodiment, the case where the chip stacked body 7 having the supporting substrate is mounted on the interposer substrate 2 will be explained.

Figure 5A:
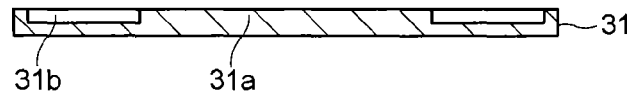
FIG. 5A to FIG. 5F are cross-sectional views each illustrating a semiconductor device according to a third embodiment and a manufacturing method thereof.

As illustrated in FIG. 5A, a supporting substrate 31 is prepared. The supporting substrate 31 has an outer shape larger than the memory chips 6 and smaller than the interposer substrate 2. The supporting substrate 31 is preferably made of a metal plate having a physical property value equivalent to that of Si. As the metal plate, an Fe—Ni based alloy plate is taken as an example. The supporting substrate 31 may also be a Si substrate, a glass substrate, or the like in place of the metal plate. The supporting substrate 31 has a chip mounting portion 31a and a groove 31b provided in the periphery of the chip mounting portion 31a. The groove 31b, as will be described in detail later, functions as a holding portion of the underfill resin. The chip mounting portion 31a has a thickness based on the original thickness of the supporting substrate 31, so that the plural memory chips 6 are stacked on the chip mounting portion 31a excellent in flatness. Thus, it is possible to improve the connection reliability by the bump electrodes 10. Further, the groove 31b is provided in the periphery of the chip mounting portion 31a, so that the underfill resin does not flow out to the outside of the supporting substrate 31.

Figure 5B:
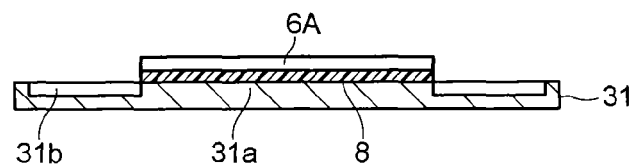
Figure 5C:
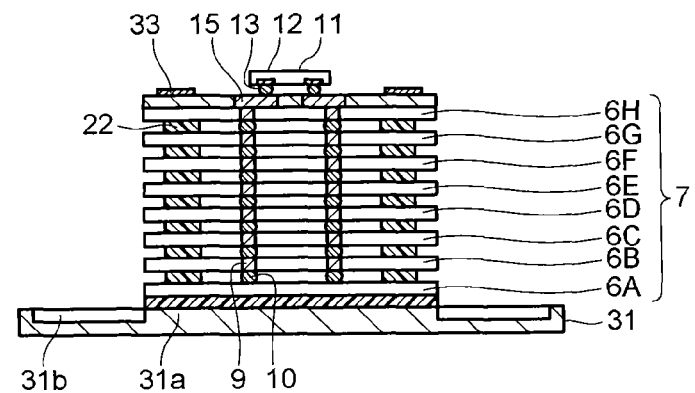

On the chip mounting portion 31a of the supporting substrate 31, the plural memory chips 6 (6A to 6H) and the IF chip 11 are stacked. As illustrated in FIG. 5B, the lowermost memory chip 6A is adhered to the chip mounting portion 31a of the supporting substrate 31. As illustrated in FIG. 5C, on the memory chip 6A, the second memory chip 6B to the eighth memory chip 6H are sequentially stacked, and finally on the memory chip 6H, the IF chip 11 is mounted. The stacking of the memory chips 6A to 6H and the mounting of the IF chip 11 are performed in the same manner as that in the second embodiment. The memory chip 6A has the first electrode terminals provided on the circuit surface. The memory chips 6B to 6H each have the first electrode terminals provided on the circuit surface and the second electrode terminals provided on the non-circuit surface. On each of the non-circuit surfaces of the memory chips 6B to 6H, the spacers 22 are further provided. The first electrode terminals are each preferably made of the metallic material, and the second electrode terminals are each preferably made of the solder material.

The memory chips 6A to 6H are stacked while, on the memory chips 6 adjacent to each other, the first electrode terminals and the second electrode terminals are connected. The gaps, each of which is between the memory chips 6 adjacent to each other, are kept by the spacers 22. Finally, the IF chip 11 having the electrode terminals formed on its circuit surface is stacked on the memory chip 6H. On the circuit surface of the uppermost memory chip 6H, the rewiring layers 15 are formed. The electrode terminals of the IF chip 11 are each made of the solder material and are connected to electrode terminals provided on the rewiring layers 15 on the memory chip 6H. The pressure-bonding temperature of the semiconductor chips may be set to the connection temperature of the electrode terminals or higher, or may also be a temperature at which the electrode terminals are temporarily fixed. In the case when the electrode terminals are temporarily fixed, all the semiconductor chips containing the memory chips 6 and the IF chip 11 are stacked, and then are pressure-bonded or reflowed in a reducing atmosphere at a temperature of the connection temperature of the electrode terminals or higher.

Figure 5D:
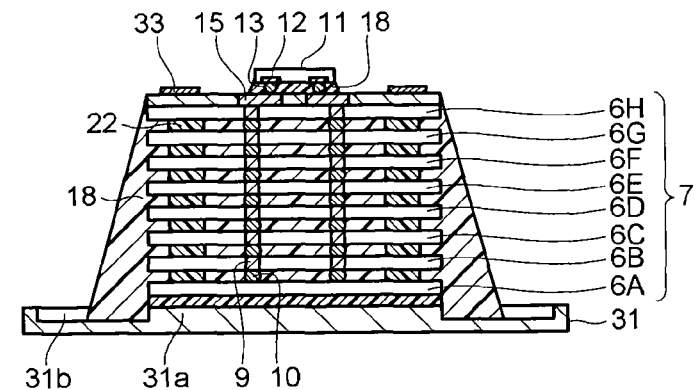

On the supporting substrate 31, the memory chips 6A to 6H are connected by the bump electrodes 10 to manufacture the chip stacked body 7, and on the chip stacked body 7, the IF chip 11 is mounted. The IF chip 11 is electrically and mechanically connected to the chip stacked body 7 via the bump electrodes 13. The spacers 22 are disposed in a gap between each two of the memory chips 6A to 6H constituting the chip stacked body 7. As illustrated in FIG. 5D, the underfill resin 18 is filled into a gap between each two of the memory chips 6A to 6H, and a gap between the memory chip 6H and the IF chip 11. The underfill resin 18 is cured. The groove 31b is provided in the periphery of the chip mounting portion 31a of the supporting substrate 31, and the underfill resin 18 protruded from an outer peripheral of the chip stacked body 7 is held in the groove 31b, and thus the underfill resin 18 does not flow out to the outside of the supporting substrate 31.

Figure 5E:
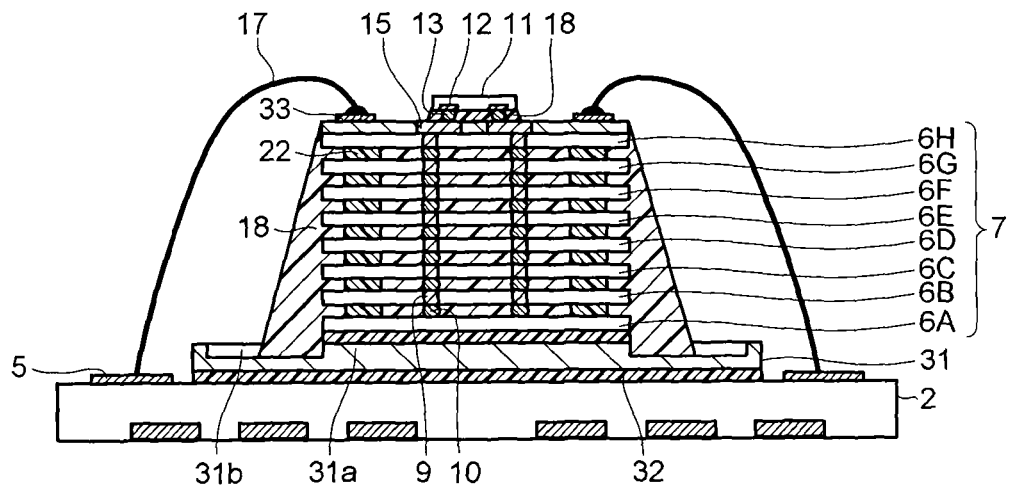
Figure 5F:
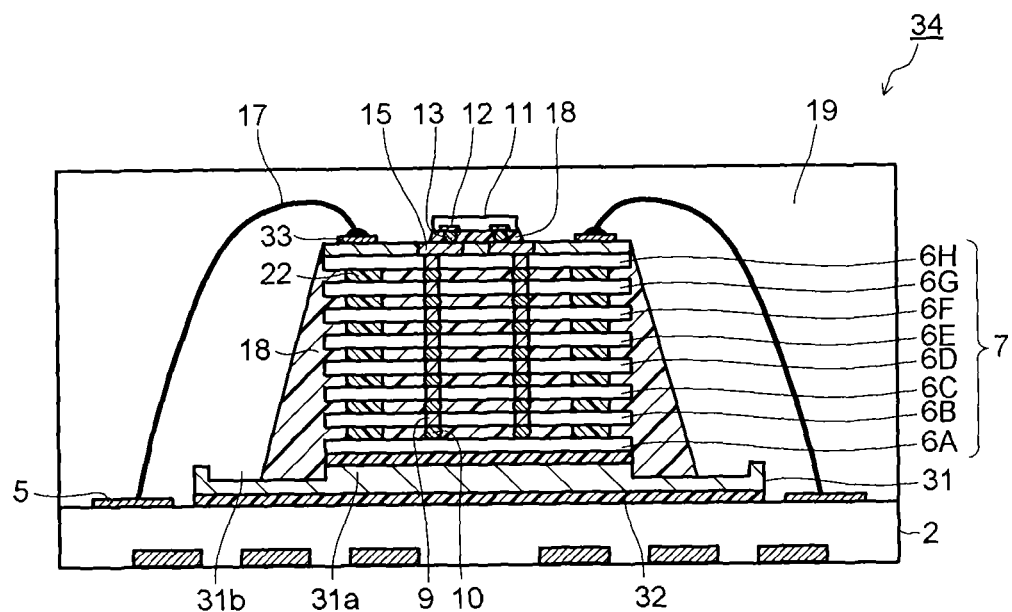

As illustrated in FIG. 5E, the chip stacked body 7 provided with the supporting substrate 31 and the IF chip 11 is mounted on the interposer substrate 2. The chip stacked body 7 is mounted by adhering the supporting substrate 31 to the interposer substrate 2 via an adhesive layer 32. The wire bonding is performed on the chip stacked body 7 mounted on the interposer substrate 2. The bonding wires 17 are each connected to a bonding pad 33 electrically connected to the rewiring layer 15 and the internal connection terminal 5 on the interposer substrate 2. As illustrated in FIG. 5F, the sealing resin layer 19 made of an insulating resin such as an epoxy resin is formed on the interposer substrate 2 so as to seal the chip stacked body 7 and the IF chip 11 together with the bonding wires 17. In this manner, a semiconductor memory device (a stack semiconductor device/stack semiconductor package) 34 in the third embodiment is manufactured.

Fourth Embodiment

Figure 6:
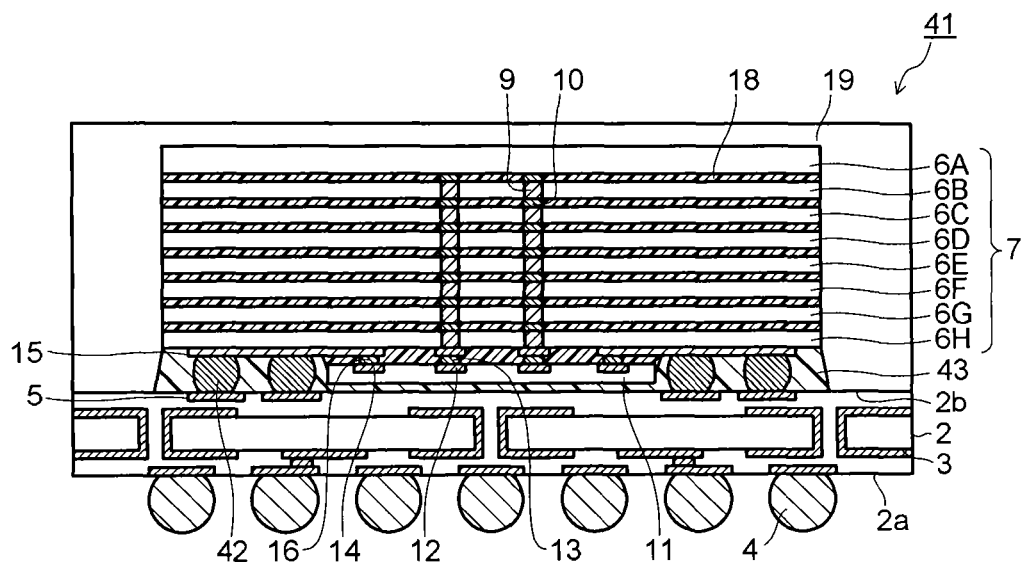
FIG. 6 is a cross-sectional view illustrating a semiconductor device according to a fourth embodiment.

Next, a semiconductor memory device according to a fourth embodiment will be explained with reference to FIG. 6. A semiconductor memory device 41 illustrated in FIG. 6 has a structure in which the IF chip 11 and the interposer substrate 2 are flip-chip connected (FC connected), in place of having the structure in which the IF chip 11 and the interposer substrate 2 are wire bonded in the first embodiment. The semiconductor memory device 41, similarly to the first embodiment, includes the chip stacked body 7 having the IF chip 11 mounted on the memory chip 6H of the uppermost tier. The structure of the chip stacked body 7, the connection structure between the chip stacked body 7 and the IF chip 11, and the like are the same as those of the semiconductor memory device 1 in the first embodiment.

The chip stacked body 7 is disposed so that the uppermost memory chip 6H in the stacking order may be positioned on the second surface 2b side of the interposer substrate 2. In the first embodiment, the order of the plural memory chips 6A to 6H when the chip stacked body 7 is disposed on the interposer substrate 2 is the same as the order (the stacking order) when the plural memory chips 6A to 6H are stacked. In the forth embodiment, the order of the plural memory chips 6A to 6H when the chip stacked body 7 is disposed on the interposer substrate 2 is reverse to the order of the plural memory chips 6A to 6H being stacked. Thus, the uppermost memory chip 6H in the stacking order is disposed at the position closest to the interposer substrate 2, and is positioned as a lowermost level on the interposer substrate 2.

On the uppermost memory chip 6H in the stacking order of the chip stacked body 7, namely on the memory chip 6H positioned as the lowermost level on the interposer substrate 2, the IF chip 11 is mounted similarly to the first embodiment. In the forth embodiment, the IF chip 11 is disposed between the interposer substrate 2 and the chip stacked body 7. On the surface of the uppermost memory chip 6H in the stacking order, the rewiring layers 15 are formed similarly to the first embodiment. One end portion of each of the rewiring layers 15 is electrically connected to the electrode 14 of the IF chip 11 via the bump electrode 16. The other end of each of the rewiring layers 15 is electrically connected to the internal connection terminal 5 on the interposer substrate 2 via a bump electrode 42.

In order to electrically connect the rewiring layer 15 and the interposer substrate 2 via the bump electrode 42, the bump electrode 42 for substrate connection has a size larger than that of the bump electrode 16 for chip connection. That is, the bump electrode 42 for substrate connection has a size large enough to be capable of securing a disposition space for the IF chip 11. Concretely, the bump electrode 42 has a size (height) large enough to be capable of securing the thickness of the IF chip 11 and the gap between the IF chip 11 and the interposer substrate 2. Incidentally, in the case when it is difficult to secure the gap between the IF chip 11 and the interposer substrate 2, a recessed portion may also be formed in the front surface of the interposer substrate 2 in manner to correspond to the disposition position of the IF chip 11.

The rewiring layers 15 formed on the surface of the uppermost memory chip 6H in the stacking order are connected to the interposer substrate 2 via the bump electrodes 42. The electrodes themselves of the memory chip 6H of the uppermost tier are connected to the IF chip 11, so that the chip stacked body 7 is electrically connected to the interposer substrate 2 via the IF chip 11. The underfill resin 18 is filled into a gap between each two of the memory chips 6 constituting the chip stacked body 7 and a gap between the memory chip 6H of the uppermost tier and the IF chip 11. Further, the underfill resin 18 is also filled into a gap between the chip stacked body 7 and the IF chip 11 and the interposer substrate 2. On the interposer substrate 2, the sealing resin layer 19 made of an insulating resin such as an epoxy resin is formed by molding, for example, so as to seal the chip stacked body 7.

Figure 7A:
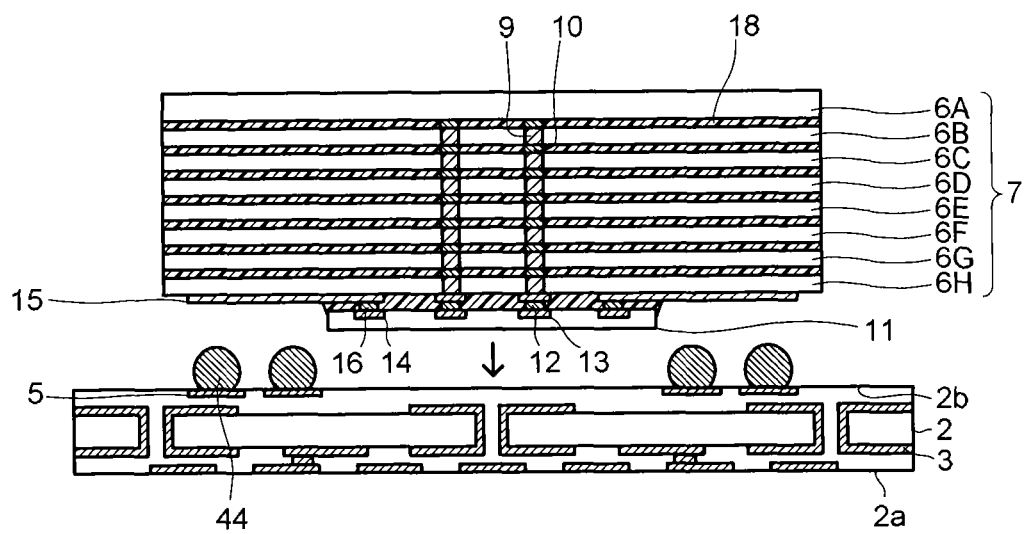
FIG. 7A to FIG. 7C are cross-sectional views each illustrating a first manufacturing method of the semiconductor device illustrated in FIG. 6.
Figure 7B:
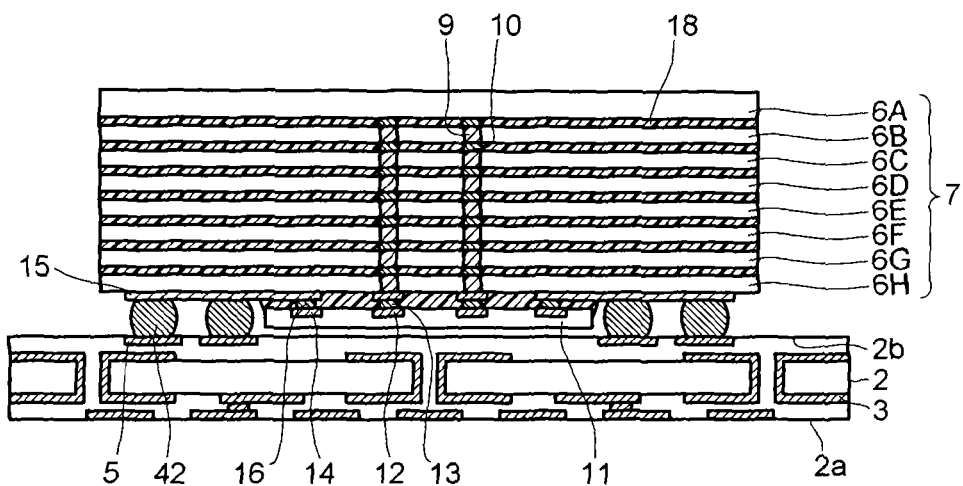
Figure 7C:
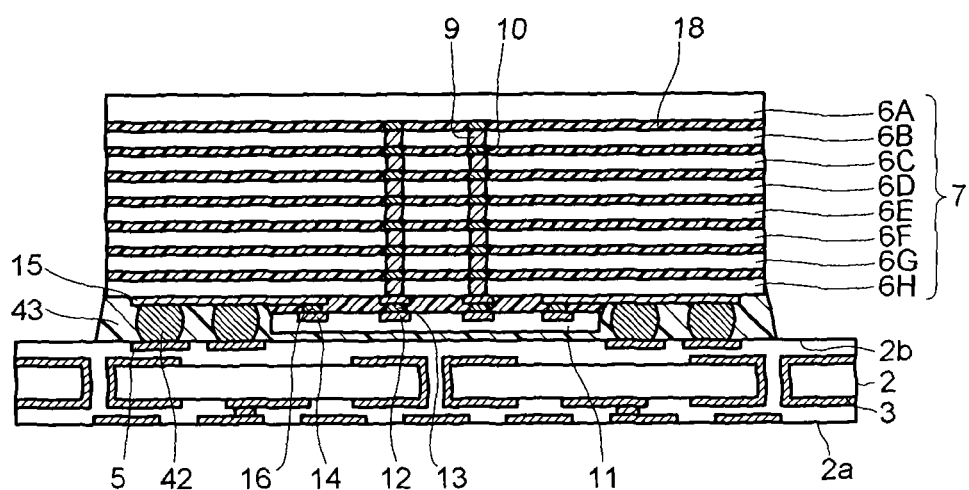

There will be described a process of mounting the chip stacked body 7 having the IF chip 11 on the interposer substrate 2 with reference to FIG. 7A to FIG. 7C. First, the chip stacked body 7 having the IF chip 11 mounted thereon is manufactured on the supporting substrate. The chip stacked body 7 is manufactured in a state of being fixed to the supporting substrate temporarily. For example, stacking of up to the IF chip 11 is performed on the chip stacked body 7, and then the chip stacked body 7 is reflowed in a reducing atmosphere, and thereby the memory chips 6 are connected and the memory chip 6 and the IF chip 11 are connected. The chip stacked body 7 is separated from the supporting substrate and then is mounted on the interposer substrate 2. As illustrated in FIG. 7A, the interposer substrate 2 having electrode terminals (solder bumps) 44 to be the bump electrodes 42 formed on the internal connection terminals 5 is prepared.

As illustrated in FIG. 7A, on the interposer substrate 2 having the electrode terminals (solder bumps) 44, the chip stacked body 7 is disposed in a reversed state to the order of the memory chips 6A to 6H being stacked. The chip stacked body 7 is disposed so that the rewiring layers 15 formed on the front surface of the memory chip 6H of the uppermost tier in the stacking order may be connected to the electrode terminals 44. As illustrated in FIG. 7B, the electrode terminals 44 are connected to the rewiring layers 15 and thereby the bump electrodes 42 are formed. The bump electrodes 42 are formed by reflowing the electrode terminals (solder bumps) 44 pressure-bonded to the rewiring layers 15 in a reducing atmosphere, for example. As illustrated in FIG. 7C, an underfill resin 43 is filled into a gap between the chip stacked body 7 containing the IF chip 11 and the interposer substrate 2 and then is cured.

Figure 8A:
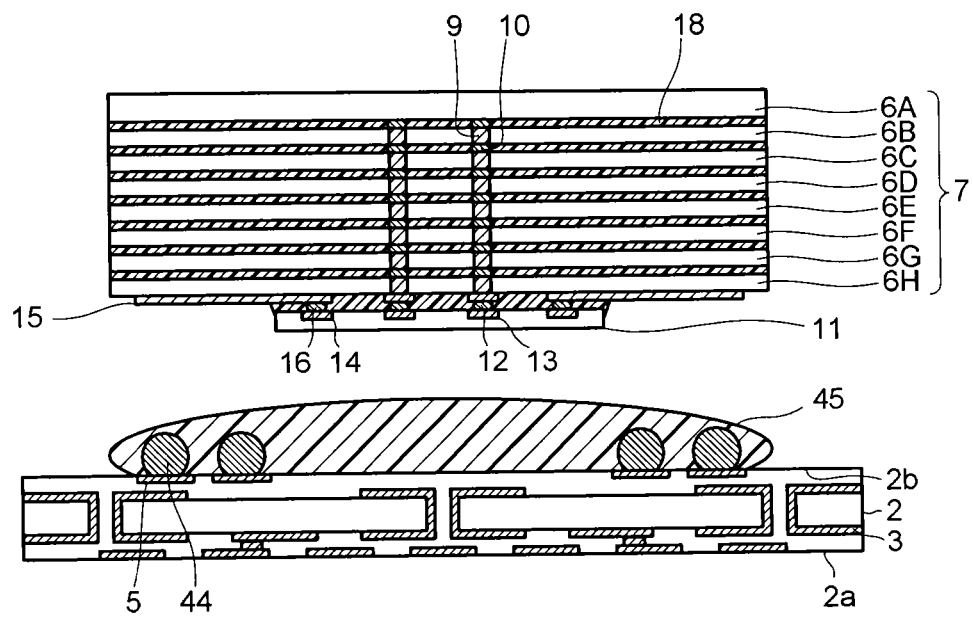
FIG. 8A and FIG. 8B are cross-sectional views each illustrating a second manufacturing method of the semiconductor device illustrated in FIG. 6.
Figure 8B:
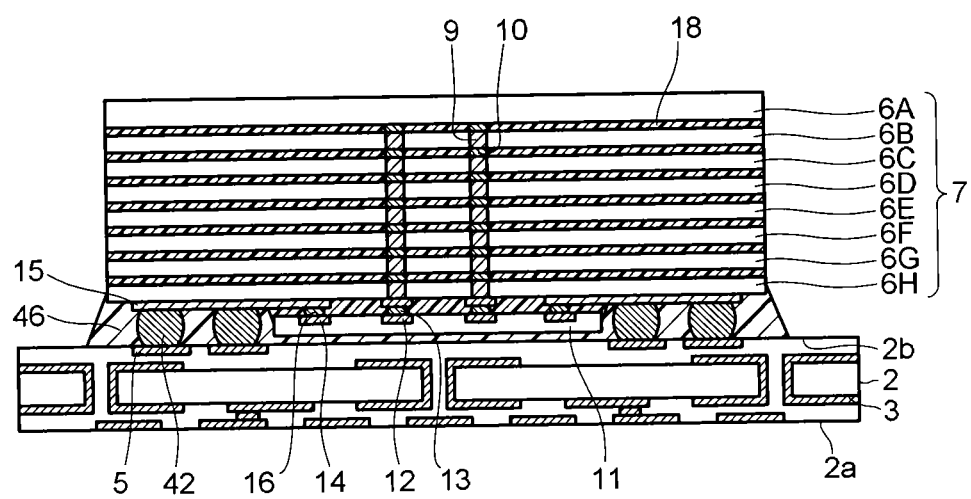

The forming process of the bump electrodes 42 may also be performed in an insulating resin having a reducing action in place of the reflow process of the electrode terminals 44 in a reducing atmosphere. As illustrated in FIG. 8A, the interposer substrate 2 having the electrode terminals (solder bumps) 44 formed on the internal connection terminals 5 is prepared. On the interposer substrate 2, an insulating resin paste 45 is applied. On the interposer substrate 2 having the insulating resin paste 45 applied thereon, the chip stacked body 7 is disposed in a reversed state to the order of the memory chips 6A to 6H being stacked. Positioning is performed so that the rewiring layers 15 may be connected to the electrode terminals 44, and then the chip stacked body 7 is pressed down against the interposer substrate 2.

The chip stacked body 7, in a state of being pressed down against the interposer substrate 2, is heated to a temperature that is equal to or higher than the connection temperature of the electrode terminals (solder bumps) 44 and is equal to or higher than the curing temperature of the insulating resin paste 45. By such a heating treatment, in the same manner as the bump electrodes 42 that connect the rewiring layers 15 and the internal connection terminals 5 on the interposer substrate 2 being formed, an underfill resin 46 made of a cured product of the insulating resin paste 45 protecting the bump electrodes 42 and the like is formed. By heating the electrode terminals (solder bumps) 44 in the insulating resin paste 45 having a reducing action, it is possible to suppress occurrence of a connection failure caused by an oxide film formed on front surfaces of the electrode terminals (solder bumps) 44, and the like. The reflow process in a reducing atmosphere is also provided with the same effect.

In the semiconductor memory device 41 in the fourth embodiment, similarly to the first embodiment, separately from the memory chips 6, the IF chip 11 is mounted on the chip stacked body 7, so that the outer shapes of the plural memory chips 6A to 6H can be set to be the same. Thus, as compared with the case where the IF circuit is mounted on the memory chip of the lowermost tier, for example, it is possible to miniaturize the chip stacked body 7 in which the plural memory chips 6A to 6H are stacked and further to reduce the package size of the semiconductor memory device 41 including the chip stacked body 7. Further, the memory chips 6 having the same structure except that the lowermost memory chip 6A does not have the through electrodes are used for the plural memory chips 6A to 6H, so that it becomes possible to achieve improvement of development efficiency, a reduction in manufacturing cost, and the like.

In the lowermost memory chip 6A in the stacking order, there is no need to form the through electrodes, so that it is possible to easily increase the thickness of the memory chip 6A of the lowermost tier. For this reason, when the plural memory chips 6A to 6H are stacked, the warpage of the memory chip 6A and the like are suppressed, and thus the electrical connection reliability between the memory chips 6 can be improved. The IF chip 11 is electrically connected to the interposer substrate 2 via the rewiring layers 15 formed on the uppermost memory chip 6H and the bump electrodes 42. In this manner, the connection structure between the IF chip 11 and the interposer substrate 2 is simplified, and thereby it is possible to reduce the number of manufacturing processes and the manufacturing cost of the chip stacked body 7 containing the IF chip 11, and it becomes possible to achieve improvement of the speed of data communications between the chip stacked body 7 and an external device, and so on.

Fifth Embodiment

Figure 9:
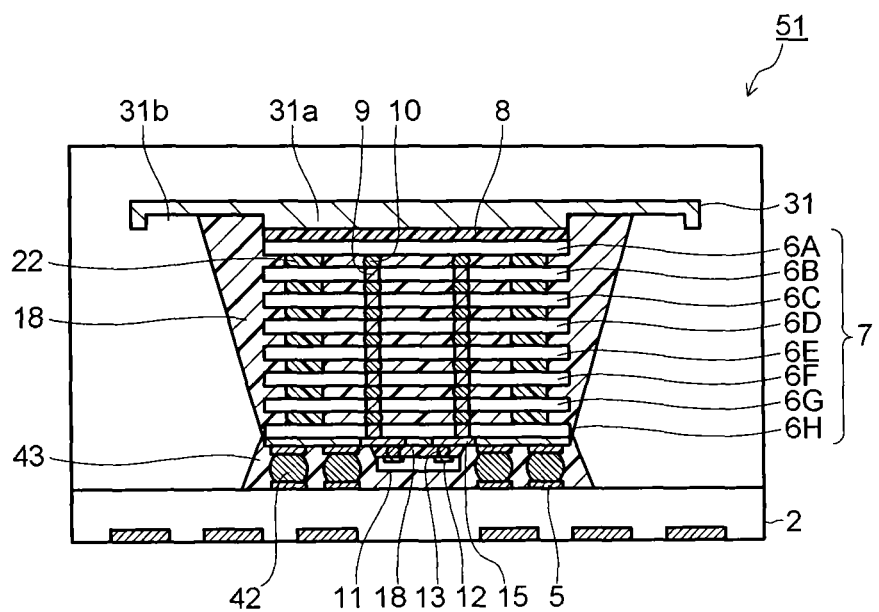
FIG. 9 is a cross-sectional view illustrating a semiconductor device according to a fifth embodiment.

Next, a semiconductor memory device according to a fifth embodiment will be explained with reference to FIG. 9. A semiconductor memory device 51 illustrated in FIG. 9 includes the chip stacked body 7 stacked on the supporting substrate 31 and the IF chip 11. The chip stacked body 7 including the supporting substrate 31 and the IF chip 11 is manufactured in the same manner as that in the third embodiment. The manufacturing process is as illustrated in FIG. 5A to FIG. 5F. The semiconductor memory device 51 has the same structure as that of the semiconductor memory device 41 according to the fourth embodiment except that the chip stacked body 7 having the supporting substrate 31 is flip-chip connected (FC connected) to the interposer substrate 2.

The chip stacked body 7 adhered to the supporting substrate 31 is disposed so that the uppermost memory chip 6H in the stacking order may be positioned closest to the interposer substrate 2. The supporting substrate 31 is disposed at the position farthest from the interposer substrate 2. The IF chip 11 is disposed between the chip stacked body 7 and the interposer substrate 2. The rewiring layers 15 formed on the front surface of the uppermost memory chip 6H are electrically connected to the internal connection terminals 5 on the interposer substrate 2 via the bump electrodes 42. Similarly to the fourth embodiment, the bump electrodes 42 for substrate connection each have a size larger than that of the bump electrode 16 for chip connection.

Figure 10A:
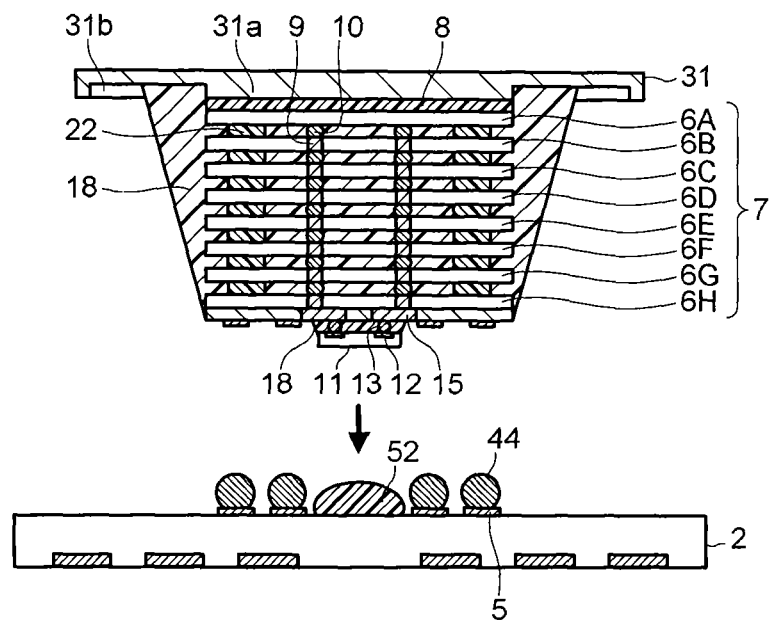
FIG. 10A and FIG. 10B are cross-sectional views each illustrating a first manufacturing method of the semiconductor device illustrated in FIG. 9.
Figure 10B:
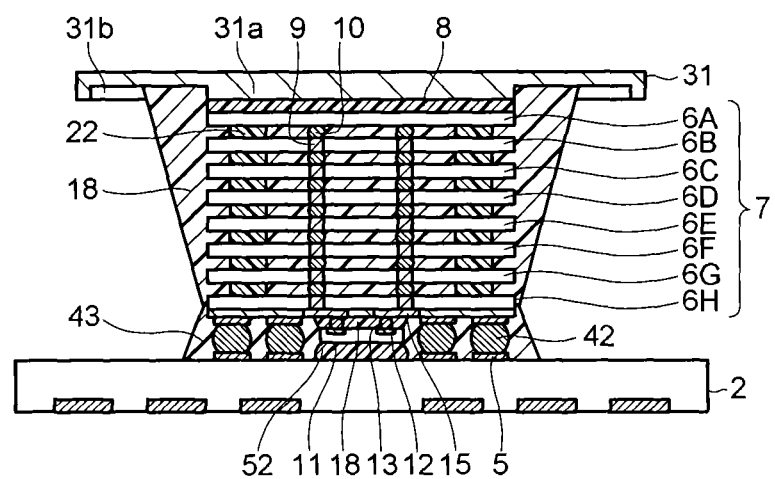

There will be described a process of mounting the chip stacked body 7 having the supporting substrate 31 and the IF chip 11 on the interposer substrate 2 with reference to FIG. 10A and FIG. 10B. The chip stacked body 7 having the IF chip 11 mounted thereon is manufactured on the supporting substrate 31. The manufacturing process of the chip stacked body 7 and the mounting process of the IF chip 11 are as illustrated in FIG. 5A to FIG. 5F. As illustrated in FIG. 10A, on the interposer substrate 2 having the electrode terminals (solder bumps) 44 formed on the internal connection terminals 5, the chip stacked body 7 is disposed in a reversed state to the order of the memory chips 6A to 6H being stacked. The rewiring layers 15 formed on the front surface of the uppermost memory chip 6H are pressure-bonded to the electrode terminals (solder bumps) 44.

As illustrated in FIG. 10A, an adhesive layer 52 may also be formed on a portion, on the interposer substrate 2, facing the IF chip 11. The adhesive layer 52 is to increase the adhesive strength between the chip stacked body 7 and the interposer substrate 2 that are not resin-sealed yet. Thereby, handleability of a structure that is not resin-sealed yet is improved. Further, a gap between the interposer substrate 2 and the IF chip 11 is filled with the adhesive layer 52, and thereby it is possible to suppress occurrence of pores caused after the underfill resin 43 is filled, and the like. For the adhesive layer 52, an adhesive containing metal particles such as Al particles may also be used. Thereby, thermal conductivity from the IF chip 11 to the interposer substrate 2 is improved. As illustrated in FIG. 10B, the electrode terminals (solder bumps) 44 pressure-bonded to the rewiring layers 15 are reflowed in a reducing atmosphere, and then the underfill resin 43 is filled into a gap between the chip stacked body 7 and the interposer substrate 2 and is cured.

Figure 11A:
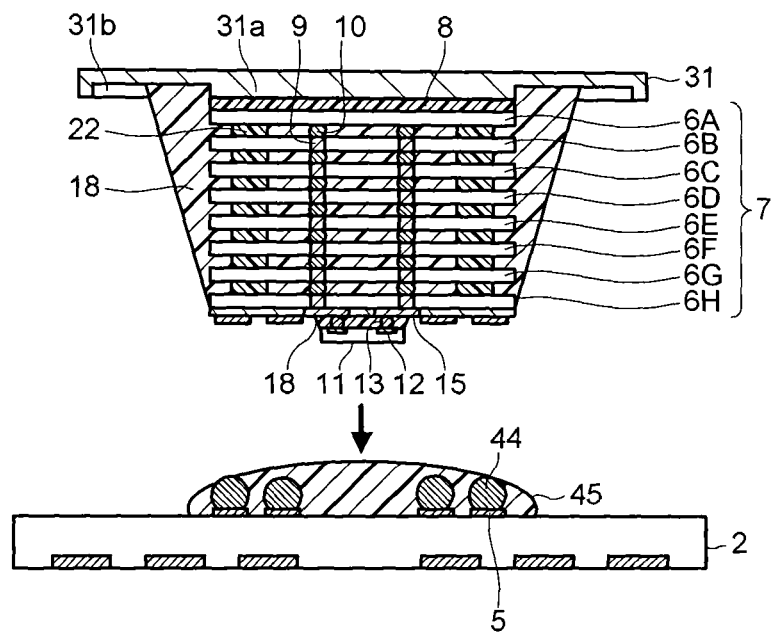
FIG. 11A and FIG. 11B are cross-sectional views each illustrating a second manufacturing method of the semiconductor device illustrated in FIG. 9.
Figure 11B:
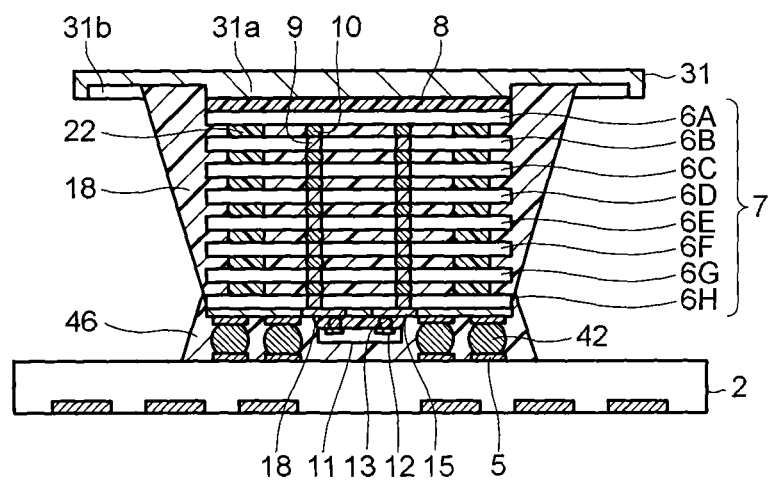

The forming process of the bump electrodes 42 may also be performed in an insulating resin having a reducing action similarly to the fourth embodiment. As illustrated in FIG. 11A, on the interposer substrate 2 having the electrode terminals (solder bumps) 44 formed on the internal connection terminals 5, the insulating resin paste 45 is applied. Positioning is performed so that the rewiring layers 15 may be connected to the electrode terminals 44, and then the chip stacked body 7 is pressed down against the interposer substrate 2. The chip stacked body 7, in a state of being pressed down against the interposer substrate 2, is heated to a temperature that is equal to or higher than the connection temperature of the electrode terminals (solder bumps) 44 and is equal to or higher than the curing temperature of the insulating resin paste 45. As illustrated in FIG. 11B, in the same manner as the bump electrodes 42 that connect the rewiring layers 15 and the interposer substrate 2 being formed, the underfill resin 46 made of a cured product of the insulating resin paste 45 protecting the bump electrodes 42 and the like is formed.

Sixth Embodiment

Figure 12:
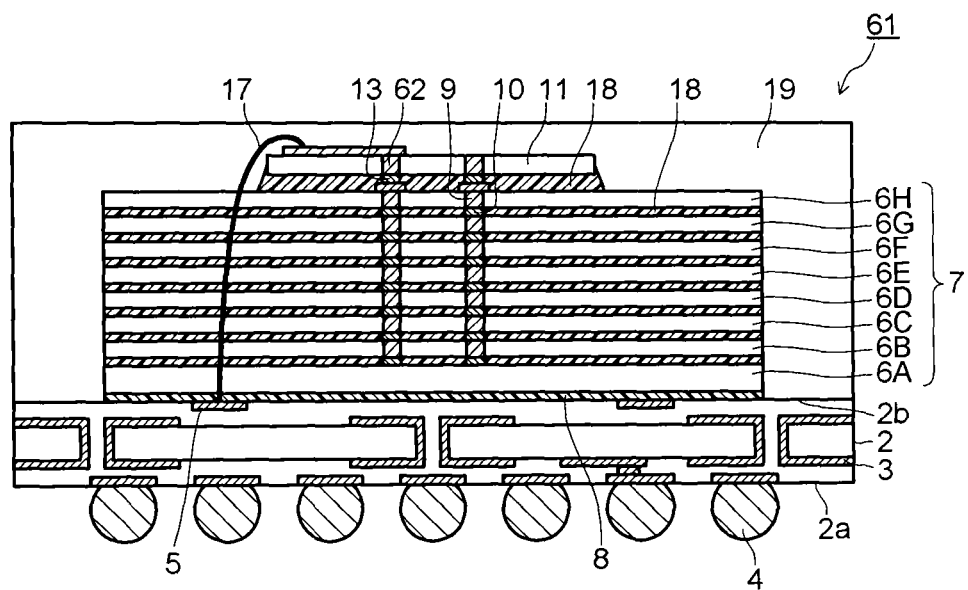
FIG. 12 is a cross-sectional view illustrating a semiconductor device according to a sixth embodiment.

Next, a semiconductor memory device according to a sixth embodiment will be explained with reference to FIG. 12. A semiconductor memory device 61 illustrated in FIG. 12 has a structure in which the bonding wire 17 is directly connected to the IF chip 11, in place of having the structure in which the bonding wire 17 is connected to the rewiring layer 15 in the first embodiment. The IF chip 11 has through electrodes 62. The bonding wire 17 electrically connecting the IF chip 11 and the interposer substrate 2 may be directly connected to a bonding pad provided on the through electrode 62 of the IF chip 11, or it may also be configured that depending on the formation position of the through electrodes 62, the rewiring layer is formed on the front surface of the IF chip 11, and the bonding wire 17 is connected to a bonding pad provided on an end portion of the rewiring layer. The configuration other than them is the same as that in the first embodiment.

According to the semiconductor memory device 61 in the sixth embodiment, the package size can be reduced similarly to the first embodiment. Further, it becomes possible to achieve improvement of development efficiency of the memory chips 6, a reduction in manufacturing cost, a reduction in mounting cost of the chip stacked body 7, and the like. When the chip stacked body 7 is adhered to the interposer substrate 2, it becomes possible to increase the electrical connection reliability between the memory chips 6. Additionally, similarly to the first embodiment, the connection structure between the IF chip 11 and the interposer substrate 2 is simplified, and thereby it is possible to reduce the number of manufacturing processes and the manufacturing cost of the chip stacked body 7 containing the IF chip 11, and further it becomes possible to achieve improvement of the speed of data communications between the chip stacked body 7 and an external device, and so on.

Seventh Embodiment

Figure 13:
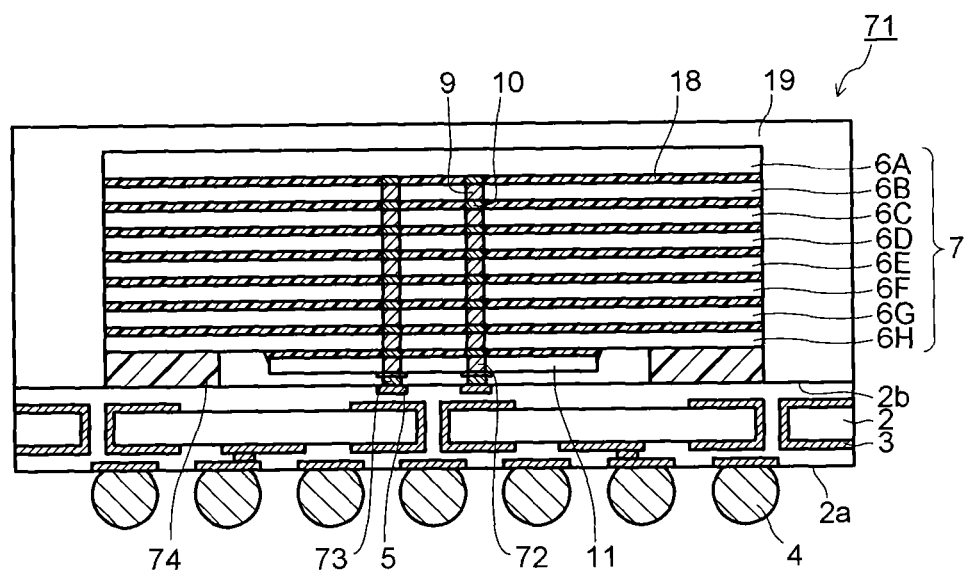
FIG. 13 is a cross-sectional view illustrating a semiconductor device according to a seventh embodiment.

Next, a semiconductor memory device according to a seventh embodiment will be explained with reference to FIG. 13. A semiconductor memory device 71 illustrated in FIG. 13 has a structure in which the bump electrodes are directly formed on the IF chip 11, in place of having the structure in which the bump electrodes 42 are formed on the rewiring layers 15 in the fourth embodiment. The IF chip 11 has through electrodes 72. The through electrodes 72 in the IF chip 11 are electrically connected to the internal connection terminals 5 on the interposer substrate 2 via bump electrodes 73. Spacers 74 are interposed between the chip stacked body 7 and the interposer substrate 2. The configuration other than them is the same as that of the fourth embodiment.

In the semiconductor memory device 71 in the seventh embodiment, similarly to the fourth embodiment, the package size can be reduced. Further, it becomes possible to achieve improvement of development efficiency of the memory chips 6, a reduction in manufacturing cost, and the like. When the plural memory chips 6A to 6H are stacked, it becomes possible to increase the electrical connection reliability between the memory chips 6. Additionally, similarly to the fourth embodiment, the connection structure between the IF chip 11 and the interposer substrate 2 is simplified, and thereby it is possible to reduce the number of manufacturing processes and the manufacturing cost of the chip stacked body 7 containing the IF chip 11, and further it becomes possible to achieve improvement of the speed of data communications between the chip stacked body 7 and an external device, and so on.

Eighth Embodiment

Next, a manufacturing process of a semiconductor device (a semiconductor memory device) according to an eighth embodiment will be explained with reference to FIG. 14A to FIG. 14H. The manufacturing process of the semiconductor device (the semiconductor memory device) according to the eighth embodiment is characterized in that a semiconductor wafer to be the lowermost memory chip is used as the supporting substrate and the chip stacked body is manufactured.

Figure 14A:
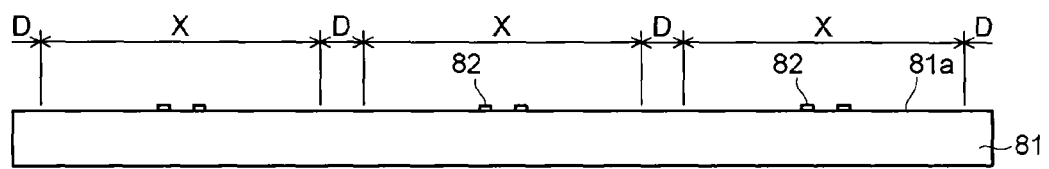
FIG. 14A to FIG. 14H are cross-sectional views each illustrating a manufacturing method of a semiconductor device according to an eighth embodiment.

As illustrated in FIG. 14A, a semiconductor wafer 81 is prepared. The semiconductor wafer 81 has plural chip areas X to be semiconductor chips after separation. The semiconductor chips based on the plural chip areas X each correspond to the lowermost memory chip of the chip stacked body. Dicing areas D are provided in gaps, each of which is between the plural chip areas X. On circuit surfaces 81a of the plural chip areas X, semiconductor element portions each having a semiconductor circuit, a wiring layer, and so on, (which are not illustrated) are formed. On each of the chip areas X, electrode terminals 82 to be the bump electrodes are formed. The chip areas X of the semiconductor wafer 81 each correspond to the lowermost memory chip, and thus each do not have the through electrodes formed therein.

Figure 14B:
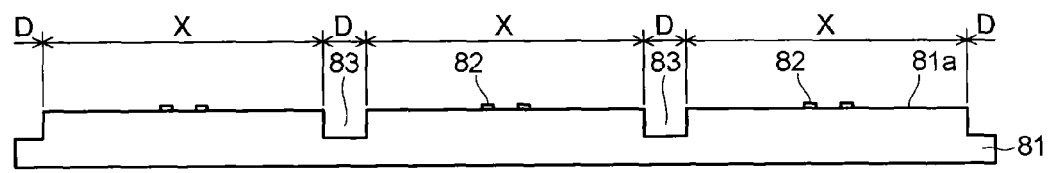

As illustrated in FIG. 14B, grooves 83 are formed in the semiconductor wafer 81 from the circuit surface 81a side. The grooves 83 are each formed by cutting the dicing area D with a blade, for example. The depth of each of the grooves 83 is set to be shallower than the thickness of the semiconductor wafer 81 and deeper than the thickness of the memory chip at the time of completion. In the semiconductor wafer 81, the grooves in a half-cut state (dicing grooves) 83 are formed. The dicing grooves 83 may also be formed by etching, or the like. The dicing grooves 83 each having such a depth are formed in the semiconductor wafer 81, and thereby the plural chip areas X are divided in a state where the plural chip areas X each correspond to the thickness of the completed semiconductor chip.

Figure 14C:
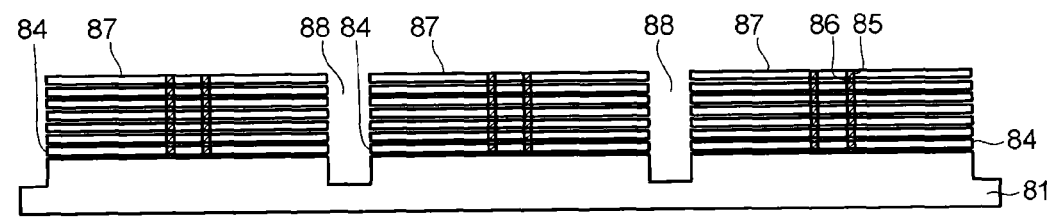

As illustrated in FIG. 14C, on the respective chip areas X of the semiconductor wafer 81 having the dicing grooves 83 in a half-cut state formed therein, separated semiconductor chips 84 are stacked. The semiconductor chips 84, similarly to the memory chips 6 in each of the above-described embodiments, each have through electrodes 85 and electrode terminals to be bump electrodes 86. In the stacking process of the semiconductor chips 84, on the chip areas X of the semiconductor wafer 81, the semiconductor chips 84 to be the memory chip of the second tier are each stacked while the electrode terminals are connected. The same stacking process is performed according to the number of the chips to be stacked, and thereby plural chip stacked bodies 87 are formed.

FIG. 14A to FIG. 14H each illustrate a state where on the respective chip areas X, the seven semiconductor chips 84 are stacked, and the chip stacked bodies 87 each in which the eight semiconductor chips to which the semiconductor chip based on the chip area X is finally added are stacked are manufactured. The number of the semiconductor chips 84 to be stacked is not limited to this. The number of the semiconductor chips 84 to be stacked is properly set according to a storage capacity of the memory chip based on the semiconductor chips 84 and the like, a storage capacity according to the chip stacked body 87 containing the chip area X, use application of the semiconductor memory device including the chip stacked body 87, and the like.

As illustrated in FIG. 14C, on the respective chip areas X of the semiconductor wafer 81, the semiconductor chips 84 having the same shape as that of the chip area X are stacked, so that spaces 88 corresponding to spaces above the dicing grooves 83 are generated in gaps, each of which is between the chip stacked bodies 87. When the underfill resin is filled into a gap between each two of the semiconductor chips 84 (containing the chip area X) constituting the chip stacked body 87, spaces 88, each of which is between the chip stacked bodies 87, are utilized. The space 88 between the chip stacked bodies 87 has a shape extending upward from the dicing groove 83 and thus is effective as a space used for filling the underfill resin into gaps in the chip stacked body 87 in which the semiconductor chips 84 are stacked in multiple.

Figure 14D:
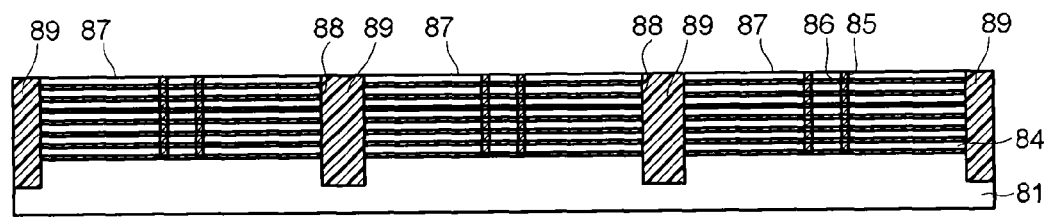

Concretely, as illustrated in FIG. 14D, an underfill resin 89 is introduced into the spaces 88 that are positioned above the dicing grooves 83 and each are between the plural chip stacked bodies 87, and thereby the underfill resin 89 is filled in the gaps in the chip stacked bodies 87. Thereafter, the underfill resin 89 is cured, and thereby the underfill resins 89 filled into the gaps in the chip stacked bodies 87, including the underfill resins 89 in the spaces 88, are cured. The underfill resin 89 is introduced into the groove-shaped spaces 88, each of which is between the plural chip stacked bodies 87, and thereby it becomes possible to finely fill the underfill resin 89 into the gaps in the chip stacked bodies 87 in which the semiconductor chips 84 (containing the chip area X) are stacked in multiple tiers.

Figure 14E:
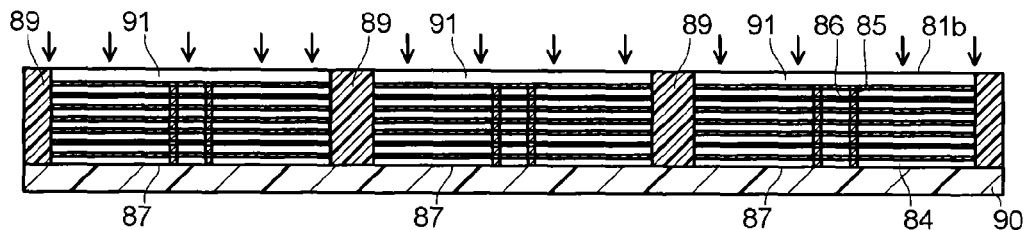

As illustrated in FIG. 14E, a protection tape 90 is stuck to the top of the chip stacked bodies 87, and then a non-circuit surface (a rear surface) 81b of the semiconductor wafer 81 is grinded. The protection tape 90 is to protect circuit surfaces of the uppermost semiconductor chips 84 of the chip stacked bodies 87 when the non-circuit surface 81b of the semiconductor wafer 81 is grinded and to maintain the shape of the semiconductor wafer 81 after the chip areas X are separated. As the protection tape 90, various types of resin tapes, and the like are used. The non-circuit surface 81b of the semiconductor wafer 81 is mechanically grinded by using, for example, a wrapping plate, and subsequently polished (for example, dry-polished) by using a polishing plate. The grinding and polishing process of the non-circuit surface 81b of the semiconductor wafer 81 is performed so as to reach the dicing grooves 83. Thereby, the semiconductor wafer 81 is divided into the respective chip areas X to be separated from each other.

Figure 14F:
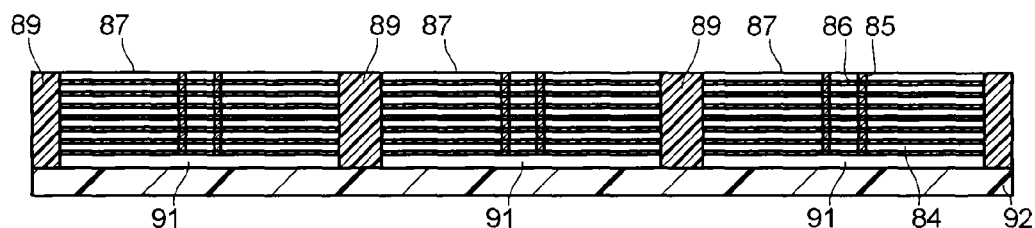
Figure 14G:
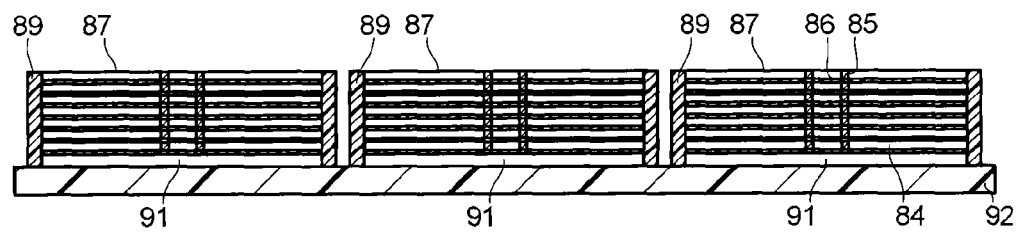

By grinding the non-circuit surface (the rear surface) 81b of the semiconductor wafer 81, the plural chip areas X are separated from each other. Thereby, the chip stacked bodies 87 each having a semiconductor chip 91 as the lowermost memory chip are manufactured. The overall shape of the semiconductor wafer 81 is kept by the underfill resins 89 introduced into the spaces 88, each of which is between the chip stacked bodies 87. As illustrated in FIG. 14F, to lowermost surfaces of the chip stacked bodies 87, that is, to non-circuit surfaces of the separated semiconductor chips 91, a dicing tape 92 is stuck, and then the protection tape 90 is peeled off. As illustrated in FIG. 14G, the underfill resins 89 existing in the spaces 88 are diced, and thereby the plural chip stacked bodies 87 are separated into individual bodies respectively.

Figure 14H:
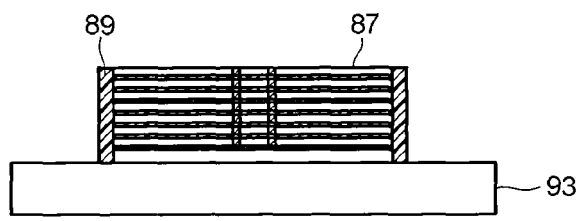

The plural chip stacked bodies 87, which are separated into individual bodies, are transferred to a pickup process being the subsequent process. The dicing tape 92 is stuck to the lowermost surface of each of the chip stacked bodies 87, and thus the plural chip stacked bodies 87 are transferred to the pickup process in a state of being stuck to the dicing tape 92. Each of the plural chip stacked bodies 87 transferred to the pickup process is sequentially picked up to be mounted on an interposer substrate 93 as illustrated in FIG. 14H. FIG. 14H illustrates the same mounted structure of the chip stacked body 87 as that in the first embodiment. On the chip stacked body 87, the IF chip is mounted, of which the illustration is omitted in FIG. 14A to FIG. 14H. As illustrated in FIG. 1, FIG. 2, FIG. 3A to FIG. 3C, and so on, the IF chip is mounted on the chip stacked body 87, and then the mounting process of the chip stacked body 87 on the interposer substrate 93 is performed.

The lowermost semiconductor chip 91 of the chip stacked body 87 is not directly electrically connected to the interposer substrate 93 similarly to the first embodiment. The thickness of the semiconductor chip 91 is preferably thicker than that of the other semiconductor chips 84. Thereby, it is suppressed that stress generated in an adhering process (the heating process) based on the difference in thermal expansion coefficient between the semiconductor chip 91 and the interposer substrate 93 adversely affects the bump electrodes and the like. Thus, it becomes possible to suppress occurrence of a connection failure caused by occurrence of cracking in and around the bump electrodes.

Then, the IF chip whose illustration is omitted, or the uppermost semiconductor chip 84 of the chip stacked body 87 and the internal connection terminal on the interposer substrate 93 are electrically connected by the bonding wire and then the chip stacked body 87 is sealed by the sealing resin layer, and thereby the semiconductor device such as the semiconductor memory device is manufactured. A circuit substrate on which the chip stacked body 87 is mounted may also be a lead frame or the like, in place of the interposer substrate 93. In the case when the same mounting structure of the chip stacked body 87 as that of the second embodiment is applied, the IF chip is mounted on the chip stacked body 87 and then the mounting process of the chip stacked body 87 on the interposer substrate 93 is performed.

Note that the configurations of the first to eighth embodiments can be applied by combining each of them, and a part thereof can also be replaced. Some embodiments of the present invention are described, but these embodiments are to be considered in all respects as illustrative and no restrictive. These embodiments may be embodied in other specific forms, and various omissions, replacements, changes can be performed without departing from the spirit or essential characteristics of the invention. These embodiments and all changes which come within the meaning and range of equivalency of the claims are therefore intended to be embraced therein.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
an interposer substrate having a first surface provided with an external connection terminal and a second surface provided with an internal connection terminal;
a chip stacked body, disposed on the second surface of the interposer substrate, having plural semiconductor chips sequentially stacked, the plural semiconductor chips being electrically connected via through electrodes provided in the semiconductor chips excluding a lowermost semiconductor chip in a stacking order of the plural semiconductor chips and a first bump electrode connecting between the through electrodes, the lowermost semiconductor chip being electrically connected to the interposer substrate via at least one semiconductor chip having the through electrode, and an uppermost semiconductor chip in the stacking order having a rewiring layer provided on a surface thereof; and
an interface chip mounted on the uppermost semiconductor chip, electrically connected to the uppermost semiconductor chip via a second bump electrode, and electrically connected to the internal connection terminal via the rewiring layer.

2. The semiconductor device according to claim 1,
wherein the chip stacked body is disposed so that the lowermost semiconductor chip is positioned on the second surface side of the interposer substrate, and
wherein the interface chip is electrically connected to the internal connection terminal via a bonding wire connected to the rewiring layer.

3. The semiconductor device according to claim 2,
wherein the lowermost semiconductor chip is adhered to the second surface of the interposer substrate.

4. The semiconductor device according to claim 2,
wherein the chip stacked body is disposed on a chip mounting portion of a supporting substrate and the supporting substrate is adhered to the second surface of the interposer substrate, and
wherein the supporting substrate has a groove provided in a periphery of the chip mounting portion, a resin is filled into a gap between the semiconductor chips, and a portion of the resin protruded from the gap is held in the groove.

5. The semiconductor device according to claim 1,
wherein the chip stacked body is disposed so that the uppermost semiconductor chip is positioned on the second surface side of the interposer substrate, and
wherein the interface chip is electrically connected to the internal connection terminal via a third bump electrode which is connected to the rewiring layer and has a size larger than that of the second bump electrode.

6. The semiconductor device according to claim 5,
wherein the chip stacked body is disposed on a chip mounting portion of a supporting substrate and the supporting substrate is adhered to the second surface of the interposer substrate, and
wherein the supporting substrate has a groove provided in a periphery of the chip mounting portion, a resin is filled into a gap between the semiconductor chips, and a portion of the resin protruded from the gap is held in the groove.

7. The semiconductor device according to claim 1, wherein the lowermost semiconductor chip has a thickness thicker than that of the other semiconductor chips.

8. The semiconductor device according to claim 1, wherein the chip stacked body has a spacer disposed in a gap between the semiconductor chips.

* * * * *